(12) United States Patent
Price et al.

(10) Patent No.: US 12,136,632 B2
(45) Date of Patent: *Nov. 5, 2024

(54) METHODS OF MANUFACTURING ELECTRONIC STRUCTURES

(71) Applicant: PRAGMATIC PRINTING LTD., Sedgefield (GB)

(72) Inventors: Richard Price, Sedgefield (GB); Catherine Ramsdale, Sedgefield (GB); Brian Hardy Cobb, Sedgefield (GB); Feras Alkhalil, Sedgefield (GB)

(73) Assignee: PRAGMATIC PRINTING LTD., Sedgefield (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/231,585

(22) Filed: Aug. 8, 2023

(65) Prior Publication Data
US 2023/0387145 A1 Nov. 30, 2023

Related U.S. Application Data

(60) Division of application No. 17/315,463, filed on May 10, 2021, now Pat. No. 11,978,744, which is a
(Continued)

(30) Foreign Application Priority Data

Mar. 31, 2017 (GB) .................................. 1705270

(51) Int. Cl.
*H01L 27/12* (2006.01)
*H01L 21/02* (2006.01)
(Continued)

(52) U.S. Cl.
CPC .... *H01L 27/1251* (2013.01); *H01L 21/02266* (2013.01); *H01L 21/02631* (2013.01);
(Continued)

(58) Field of Classification Search
CPC ............. H01L 27/1251; H01L 27/1288; H01L 29/401; H01L 29/41733
See application file for complete search history.

(56) References Cited

U.S. PATENT DOCUMENTS

| 5,396,083 A | 3/1995 | Kim et al. |
| 6,284,072 B1 | 9/2001 | Ryan et al. |

(Continued)

FOREIGN PATENT DOCUMENTS

| CN | 106206430 A | 12/2016 |
| WO | WO 2013/189160 | 12/2013 |

OTHER PUBLICATIONS

Notice of Allowance for U.S. Appl. No. 17/315,463 mailed Feb. 1, 2024.
(Continued)

*Primary Examiner* — Jay C Chang
*Assistant Examiner* — Mikka Liu
(74) *Attorney, Agent, or Firm* — Jason H. Vick; Womble Bond Dickinson (US) LLP

(57) ABSTRACT

A structure is disclosed, comprising: a first field effect transistor, FET, comprising a first source terminal, a first drain terminal, a first layer or body of semiconductive material arranged to provide a first semiconductive channel connecting the first source terminal to the first drain terminal, and a gate terminal arranged with respect to the first semiconductive channel such that a conductivity of the first semiconductive channel may be controlled by application of a voltage to the gate terminal; and a second FET comprising a second source terminal, a second drain terminal, a second layer or body of semiconductive material arranged to provide a second semiconductive channel connecting the second source terminal to the second drain terminal, and the gate terminal, the second conductive channel being arranged with respect to the gate terminal such that a conductivity of
(Continued)

the second channel may be controlled by application of a voltage to the gate terminal. Methods of manufacturing such structures are also disclosed.

21 Claims, 32 Drawing Sheets

Related U.S. Application Data continuation of application No. 16/497,636, filed as application No. PCT/GB2018/050805 on Mar. 27, 2018, now Pat. No. 11,004,875.

(51) Int. Cl.
| | |
|---|---|
| *H01L 21/027* | (2006.01) |
| *H01L 21/285* | (2006.01) |
| *H01L 21/306* | (2006.01) |
| *H01L 21/3213* | (2006.01) |
| *H01L 29/40* | (2006.01) |
| *H01L 29/417* | (2006.01) |

(52) U.S. Cl.
CPC ...... *H01L 21/0274* (2013.01); *H01L 21/2855* (2013.01); *H01L 21/30604* (2013.01); *H01L 21/32133* (2013.01); *H01L 27/1262* (2013.01); *H01L 27/127* (2013.01); *H01L 27/1288* (2013.01); *H01L 29/401* (2013.01); *H01L 29/41733* (2013.01)

(56) References Cited

U.S. PATENT DOCUMENTS

| | | | |
|---|---|---|---|
| 11,004,875 B2* | 5/2021 | Price | H01L 27/1251 |
| 2006/0267100 A1 | 11/2006 | Noguchi et al. | |
| 2009/0014799 A1 | 1/2009 | Isobe | |
| 2009/0117691 A1 | 5/2009 | Fujikawa et al. | |
| 2010/0176395 A1 | 7/2010 | Choi et al. | |
| 2013/0140569 A1* | 6/2013 | Yoneda | H01L 27/1225 |
| | | | 257/57 |
| 2013/0153890 A1 | 6/2013 | Yoneda | |
| 2013/0240886 A1* | 9/2013 | Yeh | H01L 27/1222 |
| | | | 257/57 |
| 2015/0091004 A1 | 4/2015 | Kim et al. | |
| 2016/0020299 A1 | 1/2016 | Gregory et al. | |
| 2021/0265395 A1 | 8/2021 | Price et al. | |

OTHER PUBLICATIONS

Dindar, A., et al. "Metal-Oxide Complementary Inverters with a Vertical Geometry Fabricated on Flexible Substrates" Applied Physics Letter, vol. 99, 172104; Oct. 24, 2011.
Kim, J.B. et al. "Vertically Stacked Complementary Inverters with Solution-Processed Organic Semiconductors" Organic Electronics; vol. 12, Apr. 20, 2011.
Nomura, Kenji, et al. "Three-Dimensionally Stacked Flexible Integrated Circuit: Amorphous Oxide/Polymer Hybrid Complementary Inverter Using n-type a-In—Ga—Zn—O and p-type poly-(9,9-dioctylfluorene-co-bithiophene) thin-film transistors" Applied Physics Letter, vol. 96, 263509; Jul. 2010.
International Search Report for International Application No. PCT/GB20018/050805, mailed Jul. 3, 2018.
Written Opinion for International Application No. PCT/GB20018/050805, mailed Jul. 3, 2018.
International Preliminary Report on Patentability for International Application No. PCT/GB2018/050805, mailed Oct. 10, 2019.
Search Report for Great Britain Patent Application No. GB1705270.5, mailed Sep. 13, 2017.
Combined Search and Examination Report Under Sections 17 and 18(3) for Great Britain Application No. 2201158.9, mailed Mar. 17, 2022.
Examination Report Under Section 18(3) for Great Britain Application No. 2201158.9, mailed Apr. 22, 2022.
Search Report Under Section 17(6) for Great Britain Application No. 2201158.9 mailed Apr. 22, 2022.
Office Action for U.S. Appl. No. 16/497,636, mailed Aug. 21, 2020.
Notice of Allowance for U.S. Appl. No. 16/497,636, mailed Jan. 12, 2021.
Office Action for U.S. Appl. No. 17/315,463 mailed Oct. 14, 2022.
Office Action for U.S. Appl. No. 17/315,463 mailed Jun. 5, 2023.
Office Action for U.S. Appl. No. 17/315,463 mailed Oct. 12, 2023.

* cited by examiner

STEP 1
- Prepare substrate e.g glass, silicon, plastic
- Optionally deposit a passivation layer STEP 6
• Deposit electrode 2

STEP 7
• Pattern electrode 2

STEP 1
- Prepare substrate e.g. glass, silicon, plastic
- Optionally deposit a passivation layer

METHODS OF MANUFACTURING ELECTRONIC STRUCTURES

CROSS REFERENCE TO RELATED APPLICATIONS

This application is a divisional of U.S. patent application Ser. No. 17/315,463, filed May 10, 2021, now U.S. Pat. No. 11,978,744, which is a continuation of U.S. patent application Ser. No. 16/497,636, filed Sep. 25, 2019, now U.S. Pat. No. 11,004,875, which is a national stage application under 35 U.S.C. 371 of PCT Application No. PCT/GB2018/050805, having an international filing date of 27 Mar. 2018, which designated the United States, which PCT application claimed the benefit of Great Britain Application No. 1705270.5, filed 31 Mar. 2017, each of which are incorporated herein by reference in their entirety.

FIELD OF THE INVENTION

The present invention relates to electronic structures comprising two field effect transistors, FETs, and more particularly, although not exclusively, to structures comprising complementary and symmetrical pairs of P-type and N-type semiconductor FETs.

BACKGROUND TO THE INVENTION

Complementary metal oxide semiconductor (Cmos) is a well-known technology for constructing integrated circuits, and typically uses complementary and symmetrical pairs of P-type and N-type metal oxide semiconductor FETs (MOSFETs) for logic functions.

Although the implementation of CMOS technology on conventional silicon wafers is well-established, implementation of CMOS technology or analogous technology utilising complementary pairs of P-type and N-type FETs in different applications, such as printed and/or flexible electronic circuits is problematic and non-trivial.

SUMMARY OF THE INVENTION

Certain aspects and embodiments of the present invention aim to produce electronic structures comprising two FETs, for example complementary pairs of N-type and P-type FETs, and corresponding methods of manufacture which are suitable for implementation and incorporation in printed and/or flexible electronic circuits.

A first aspect of the invention provides a structure (which may also be referred to as an electronic structure) comprising:
  a first field effect transistor, FET, comprising a first source terminal, a first drain terminal, a first layer or body of semiconductive material arranged to provide a first semiconductive channel connecting the first source terminal to the first drain terminal, and a gate terminal arranged with respect to (e.g. over) the first semiconductive channel such that a conductivity of the first semiconductive channel may be controlled by application of a voltage to the gate terminal; and
  a second FET comprising a second source terminal, a second drain terminal, a second layer or body of semiconductive material arranged to provide a second semiconductive channel connecting the second source terminal to the second drain terminal, and said gate terminal, the second conductive channel being arranged with respect to (e.g. over) said gate terminal such that a conductivity of the second channel may be controlled by application of a voltage to the gate terminal (whereby application of a voltage to the gate terminal may control (e.g. simultaneously) conductivities of both the first and second channels).

In certain embodiments the first layer or body of semiconductive material comprises a first semiconductive material and the second layer or body of semiconductive material comprises a second semiconductive material, different from said first semiconductive material.

In certain embodiments one of the first and second semiconductive materials is an n-type semiconductor, and the other one of the first and second semiconductive materials is a p-type semiconductor.

In certain embodiments the first layer or body of semiconductive material is arranged to overlap at least one of the first source and drain terminals.

In certain embodiments the first layer or body of semiconductive material is arranged to overlap both of the first source and drain terminals.

In certain embodiments the first layer or body of semiconductive material is arranged not to overlap either of the first source and drain terminals.

In certain embodiments the first source and drain terminals are formed over the first layer or body of semiconductive material.

In certain embodiments the first layer or body of semiconductive material, the gate terminal, and the second layer or body of semiconductive material are arranged with respect to each other in a stack configuration (e.g. a vertical stack).

In certain embodiments the first layer or body of semiconductive material, the gate terminal, and the second layer or body of semiconductive material are stacked in a nominal vertical direction.

In certain embodiments the first layer or body of semiconductive material, the gate terminal, and the second layer or body of semiconductive material have the same area as one another.

In certain embodiments the first layer or body of semiconductive material, the gate terminal, and the second layer or body of semiconductive material are aligned (e.g. vertically aligned) with one another.

In certain embodiments the gate terminal is substantially planar, and the first layer or body of semiconductive material and the second layer or body of semiconductive material are arranged respectively below and above the gate terminal, spaced from the gate terminal in a direction normal to the plane of the gate terminal.

In certain embodiments the first layer or body of semiconductive material, the gate terminal, and the second layer or body of semiconductive material each have the same projection onto the plane of the gate terminal.

In certain embodiments the first layer or body of semiconductive material and the gate terminal each have the same projection onto the plane of the gate terminal, and the second layer or body of semiconductive material has a different projection onto the plane of the gate terminal.

In certain embodiments said projection of the first layer or body of semiconductive material and the gate terminal is larger than said projection of the second layer or body of semiconductive material.

In certain embodiments the first FET comprises a first layer or body of dielectric material separating the gate from the first layer or body of semiconductive material, and the second FET comprises a second layer or body of dielectric material separating the gate from the second layer or body of semiconductive material.

In certain embodiments the first and second layers or bodies of dielectric material are aligned with the first and second layers or bodies of semiconductive material in a stack configuration.

In certain embodiments the structure further comprises at least one further layer or body of dielectric material arranged between (i.e. to separate) the first source terminal and the second source terminal, and between (i.e. to separate) the first drain terminal and the second drain terminal.

In certain embodiments the structure further comprises at least one further layer or body of dielectric material arranged to separate said terminals of the first FET from said terminals of the second FET.

In certain embodiments the second source terminal and the second drain terminal each comprise a respective via extending through the at least one further layer or body of dielectric material to contact said second layer or body of semiconductive material.

In certain embodiments said at least one further layer or body of dielectric material is arranged to surround a stack comprising the gate terminal and the first and second layers or bodies of semiconductive material.

In certain embodiments the structure further comprises at least one further layer or body of dielectric material formed over the second layer or body of semiconductive material, wherein the second source terminal and the second drain terminal each comprise a respective via extending through the or each further layer or body of dielectric material to contact said second layer or body of semiconductive material.

In certain embodiments said vias are positioned over respective portions of the first source and first drain terminals.

In certain embodiments said vias are arranged over the first semiconductive channel, and do not overlap either of the first source and first drain terminals.

In certain embodiments the structure further comprises a second gate terminal arranged with respect to the second layer or body of semiconductive material and to which a voltage may be applied to control conductivity of the second semiconductive channel.

In certain embodiments said second gate is arranged above the second semiconductive channel (e.g. between the second source and drain terminals).

In certain embodiments the second gate is separated from the second layer or body of semiconductive material by at least one layer or body of dielectric material.

In certain embodiments the structure further comprises a support arranged to directly support the first semiconductive channel, and optionally the first source and drain terminals In certain embodiments the support comprises a substrate, and optionally a passivation layer formed on the substrate.

Another aspect provides a method of manufacturing a structure (electronic structure) comprising a first FET and a second FET, the method comprising:
  providing a support;
  forming a first layer or body of conductive material on the support;
  patterning the first layer or body of conductive material to define a first source terminal, a first drain terminal, and a first gap separating the first source terminal and the first drain terminal;
  forming a first layer or body of semiconductive material covering the first source and first drain terminals and filling the gap so as to provide a first semiconductive channel connecting the first source terminal to the first drain terminal;
  forming a first layer or body of dielectric material over the first layer or body of semiconductive material;
  forming a layer or body of conductive (gate) material over the first layer or body of dielectric material;
  forming a second layer or body of dielectric material over the layer or body of conductive (gate) material;
  forming a second layer or body of semiconductive material over the second layer or body of dielectric material;
  patterning the first and second layers or bodies of semiconductive material, the first and second layers or bodies of dielectric material, and said layer or body of conductive (gate) material to uncover (expose) portions of the first source and first drain terminals and produce a stack comprising the first semiconductive channel, a portion of the first layer or body of dielectric material over said first channel, a portion of the layer or body of conductive (gate) material over said first channel, a portion of the layer or body of second dielectric material over said first channel, and a portion of the second layer or body of semiconductive material over the first channel;
  forming at least one further layer or body of dielectric material over the stack to cover the stack and said uncovered portions of the first source and drain terminals;
  patterning the at least one further layer or body of dielectric material to form first and second windows through the at least one further layer or body of dielectric material to said portion of the second layer or body of semiconductive material; and
  forming a second source terminal comprising conductive material at least partially filling the first window, and a second drain terminal comprising conductive material at least partially filling the second window, such that said portion of the second layer or body of semiconductive material provides a second semiconductive channel, connecting the second source terminal to the second drain terminal,
  whereby the first FET comprises the first source terminal, the first drain terminal, the first channel, and said portion of the layer or body of conductive (gate) material, the second FET comprises the second source terminal, the second drain terminal, the second channel, and said portion of the layer or body of conductive (gate) material.

In certain embodiments said stack overlaps at least one of the first source and first drain terminals.

In certain embodiments said stack overlaps both of the first source and first drain terminals.

In certain embodiments said first window is positioned above a portion of the first source terminal overlapped by the stack and said second window is positioned above a portion of the first drain terminal overlapped by the stack.

In certain embodiments said stack does not overlap either the first source or the first drain terminal.

Another aspect provides a method of manufacturing a structure (electronic structure) comprising a first FET and a second FET, the method comprising:
  providing a support;
  forming a first layer or body of conductive material on the support;

patterning the first layer or body of conductive material to define a first source terminal, a first drain terminal, and a first gap separating the first source terminal and the first drain terminal;

forming a first layer or body of semiconductive material covering the first source and first drain terminals and filling the gap so as to provide a first semiconductive channel connecting the first source terminal to the first drain terminal;

forming a first layer or body of dielectric material over the first layer or body of semiconductive material;

forming a layer or body of conductive (gate) material over the first layer or body of dielectric material;

patterning the first layer or body of semiconductive material, the first layer or body of dielectric material, and said layer or body of conductive (gate) material to uncover (expose) at least portions of the first source and first drain terminals and produce a first stack comprising the first semiconductive channel, a portion of the first layer or body of dielectric material over said first channel, and a portion of the layer or body of conductive (gate) material over said first channel;

forming a second layer or body of dielectric material over the first stack and uncovered portions of the first source and first drain terminals;

forming a second layer or body of semiconductive material over the second layer or body of dielectric material;

patterning the second layer or body of semiconductive material and the second layer or body of dielectric material to uncover (expose) at least portions of the first source and first drain terminals and produce a second stack comprising the first semiconductive channel, said portion of the first layer or body of dielectric material over said first channel, said portion of the layer or body of conductive (gate) material over said first channel, a portion of the layer or body of second dielectric material over said first channel, and a portion of the second layer or body of semiconductive material over the first channel;

forming at least one further layer or body of dielectric material over the second stack to cover the second stack and said uncovered portions of the first source and drain terminals (not covered by the second stack);

patterning the at least one further layer or body of dielectric material to form first and second windows through the at least one further layer or body of dielectric material to said portion of the second layer or body of semiconductive material;

forming a second source terminal comprising conductive material at least partially filling the first window, and a second drain terminal comprising conductive material at least partially filling the second window, such that said portion of the second layer or body of semiconductive material provides a second semiconductive channel, connecting the second source terminal to the second drain terminal, whereby the first FET comprises the first source terminal, the first drain terminal, the first channel, and said portion of the layer or body of conductive (gate) material, the second FET comprises the second source terminal, the second drain terminal, the second channel, and said portion of the layer or body of conductive (gate) material.

In certain embodiments said patterning to uncover (expose) at least portions of the first source and first drain terminals and produce said first stack comprises forming a layer of photoresist over said layers to be patterned, exposing the structure from below with electromagnetic radiation such that the first source and first drain terminals shield portions of the photoresist from said radiation and a portion of the photoresist above the first semiconductive channel is exposed, processing the photoresist to leave the exposed portion and remove the unexposed portions, removing portions of the layers to be patterned that were beneath the unexposed portions of photoresist, and then removing the exposed portion of photoresist from the top of the first stack.

In certain embodiments said patterning of the at least one further layer or body of dielectric material to form said first and second windows comprises:

forming a layer or body of photoresist on the at least one further layer;

exposing the photoresist to radiation through a mask arranged to leave portions unexposed and expose a portion over the second semiconductive channel;

processing the photoresist to reduce a solubility of the exposed portion (e.g. cross-link the exposed portion);

exposing the structure to radiation from below such that the first electrodes shield portions of the photoresist and further portions are reverse exposed;

processing the photoresist to remove the reverse exposed portions and form windows through the photoresist;

removing material of the at least one further layer through said windows in the photoresist layer to form said first window and said second window; and removing remaining photoresist material.

In certain embodiments said second stack does not overlap either the first source or the first drain terminal.

Another aspect provides a method of manufacturing a structure (electronic structure) comprising a first FET and a second FET, the method comprising:

providing a support;

forming a first layer or body of conductive material on the support;

patterning the first layer or body of conductive material to define a first source terminal, a first drain terminal, and a first gap separating the first source terminal and the first drain terminal;

forming a first layer or body of semiconductive material covering the first source and first drain terminals and filling the gap so as to provide a first semiconductive channel connecting the first source terminal to the first drain terminal;

forming a first layer or body of dielectric material over the first layer or body of semiconductive material;

forming a layer or body of conductive (gate) material over the first layer or body of dielectric material;

forming a second layer or body of dielectric material over the layer or body of conductive (gate) material;

forming a second layer or body of semiconductive material over the second layer or body of dielectric material;

patterning the first and second layers or bodies of semiconductive material, the first and second layers or bodies of dielectric material, and said layer or body of conductive (gate) material to uncover (expose) at least portions of the first source and first drain terminals and produce a stack comprising the first semiconductive channel, a portion of the first layer or body of dielectric material over said first channel, a portion of the layer or body of conductive (gate) material over said first channel, a portion of the layer or body of second dielectric material over said first channel, and a portion of the second layer or body of semiconductive material over the first channel;

forming at least one further layer or body of dielectric material over the stack to cover the stack and said uncovered portions of the first source and drain terminals;

patterning the at least one further layer or body of dielectric material to form first and second windows through the at least one further layer or body of dielectric material to said portion of the second layer or body of semiconductive material;

forming a second source terminal comprising conductive material at least partially filling the first window, and a second drain terminal comprising conductive material at least partially filling the second window, such that said portion of the second layer or body of semiconductive material provides a second semiconductive channel, connecting the second source terminal to the second drain terminal, whereby the first FET comprises the first source terminal, the first drain terminal, the first channel, and said portion of the layer or body of conductive (gate) material, the second FET comprises the second source terminal, the second drain terminal, the second channel, and said portion of the layer or body of conductive (gate) material.

In certain embodiments said patterning to uncover (expose) at least portions of the first source and first drain terminals and produce said stack comprises forming a layer of photoresist over said layers to be patterned, exposing the structure from below with electromagnetic radiation such that the first source and first drain terminals shield portions of the photoresist from said radiation, processing the photoresist to leave the exposed portion and remove the unexposed portions, removing portions of the layers to be patterned that were beneath the unexposed portions of photoresist, and then removing the exposed portion of photoresist from the top of the stack.

In certain embodiments said patterning of the at least one further layer or body of dielectric material to form said first and second windows comprises:

forming a layer or body of photoresist on the at least one further layer;

exposing the photoresist to radiation through a mask arranged to leave portions unexposed and expose a portion over the second semiconductive channel;

processing the photoresist to reduce a solubility of the exposed portion (e.g. cross-link the exposed portion);

exposing the structure to radiation from below such that the first electrodes shield portions of the photoresist and further portions are reverse exposed;

processing the photoresist to remove the reverse exposed portions and form windows through the photoresist;

removing material of the at least one further layer through said windows in the photoresist layer to form said first window and said second window; and removing remaining photoresist material.

In certain embodiments said stack does not overlap either the first source or the first drain terminal.

In certain embodiments said patterning the at least one further layer or body of dielectric material to form first and second windows further comprises forming at least one of a third window down to the gate terminal and a fourth window down to one of the first source terminal and the first drain terminal.

Another aspect provides a method of manufacturing a structure (electronic structure) comprising a first FET and a second FET, the method comprising:

providing a support;

forming a first source terminal, a first drain terminal, and a first layer or body of semiconductive material supported on (by) the support, the first layer or body of semiconductive material providing a first semiconductive channel connecting the first source terminal to the first drain terminal;

forming a first layer or body of dielectric material over the first layer or body of semiconductive material;

forming a layer or body of conductive (gate) material over the first layer or body of dielectric material;

forming a second layer or body of dielectric material over the layer or body of conductive (gate) material;

forming a second layer or body of semiconductive material over the second layer or body of dielectric material;

patterning the first and second layers or bodies of semiconductive material, the first and second layers or bodies of dielectric material, and said layer or body of conductive (gate) material to uncover (expose) portions of the first source and first drain terminals and produce a stack comprising the first semiconductive channel, a portion of the first layer or body of dielectric material over said first channel, a portion of the layer or body of conductive (gate) material over said first channel, a portion of the layer or body of second dielectric material over said first channel, and a portion of the second layer or body of semiconductive material over the first channel;

forming at least one further layer or body of dielectric material over the stack to cover the stack and said uncovered portions of the first source and drain terminals;

patterning the at least one further layer or body of dielectric material to form first and second windows through the at least one further layer or body of dielectric material to said portion of the second layer or body of semiconductive material; and forming a second source terminal comprising conductive material at least partially filling the first window, and a second drain terminal comprising conductive material at least partially filling the second window, such that said portion of the second layer or body of semiconductive material provides a second semiconductive channel, connecting the second source terminal to the second drain terminal, whereby the first FET comprises the first source terminal, the first drain terminal, the first channel, and said portion of the layer or body of conductive (gate) material, the second FET comprises the second source terminal, the second drain terminal, the second channel, and said portion of the layer or body of conductive (gate) material.

Another aspect provides an electronic circuit comprising a structure in accordance with any other aspect or embodiment.

Further aspects and embodiments of the invention, and their associated advantages and the technical problems they address/solve at least partly will be appreciated from the following detailed description of the accompanying figures, of which FIGS. 1-5 illustrate steps in a method of producing an electronic structure in accordance with a first aspect of the invention;

FIG. 11 illustrates an electronic structure embodying another aspect of the invention;

FIG. 30 illustrates another electronic circuit in accordance with an embodiment of an aspect of the invention;

DETAILED DESCRIPTION OF EMBODIMENTS OF THE INVENTION

Figure 1:
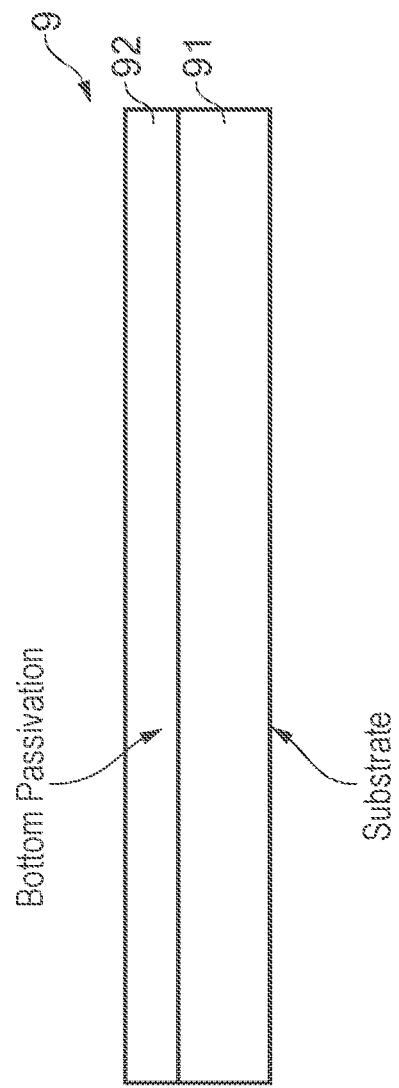
Figure 3:
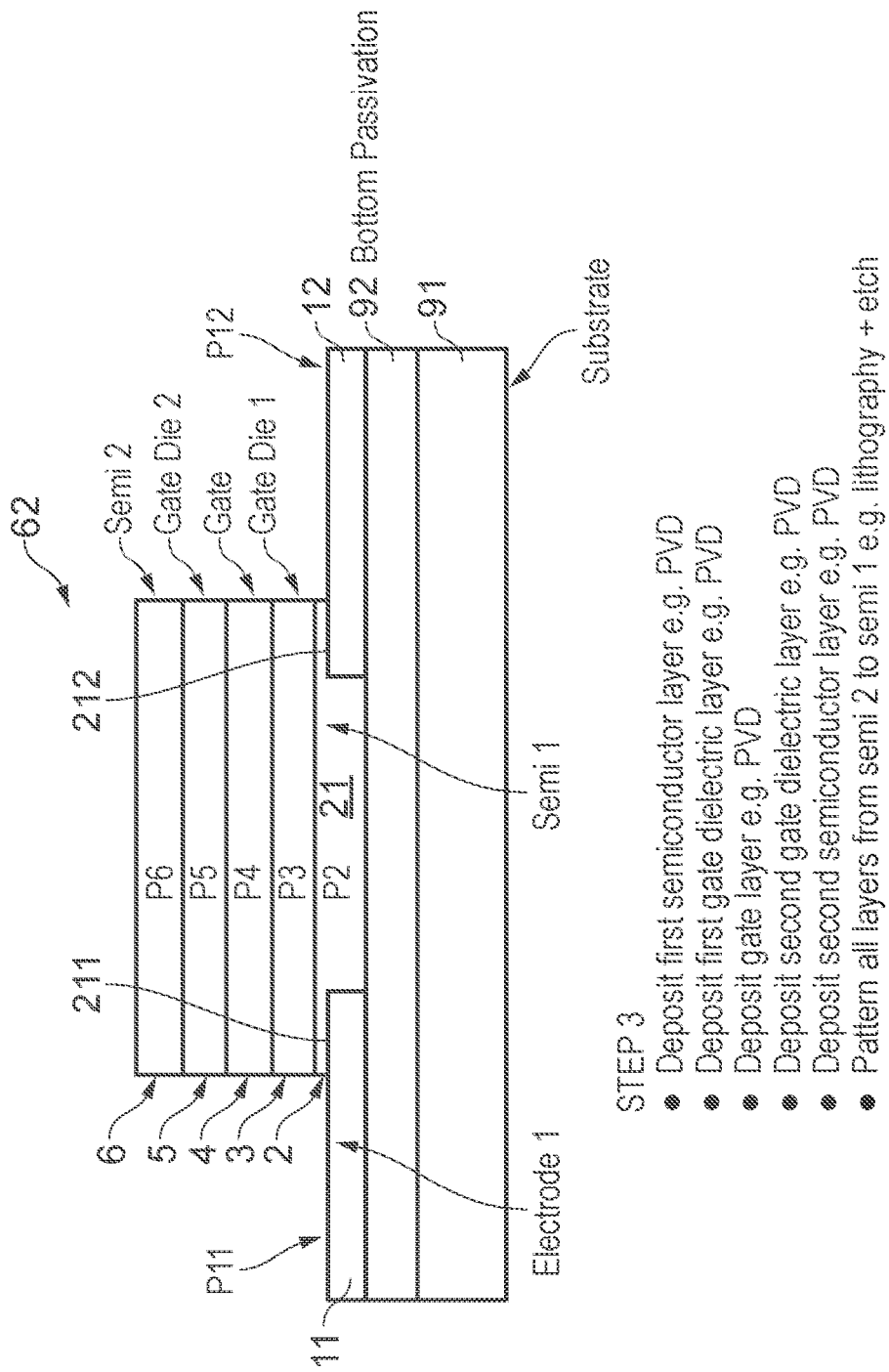
Figure 4:
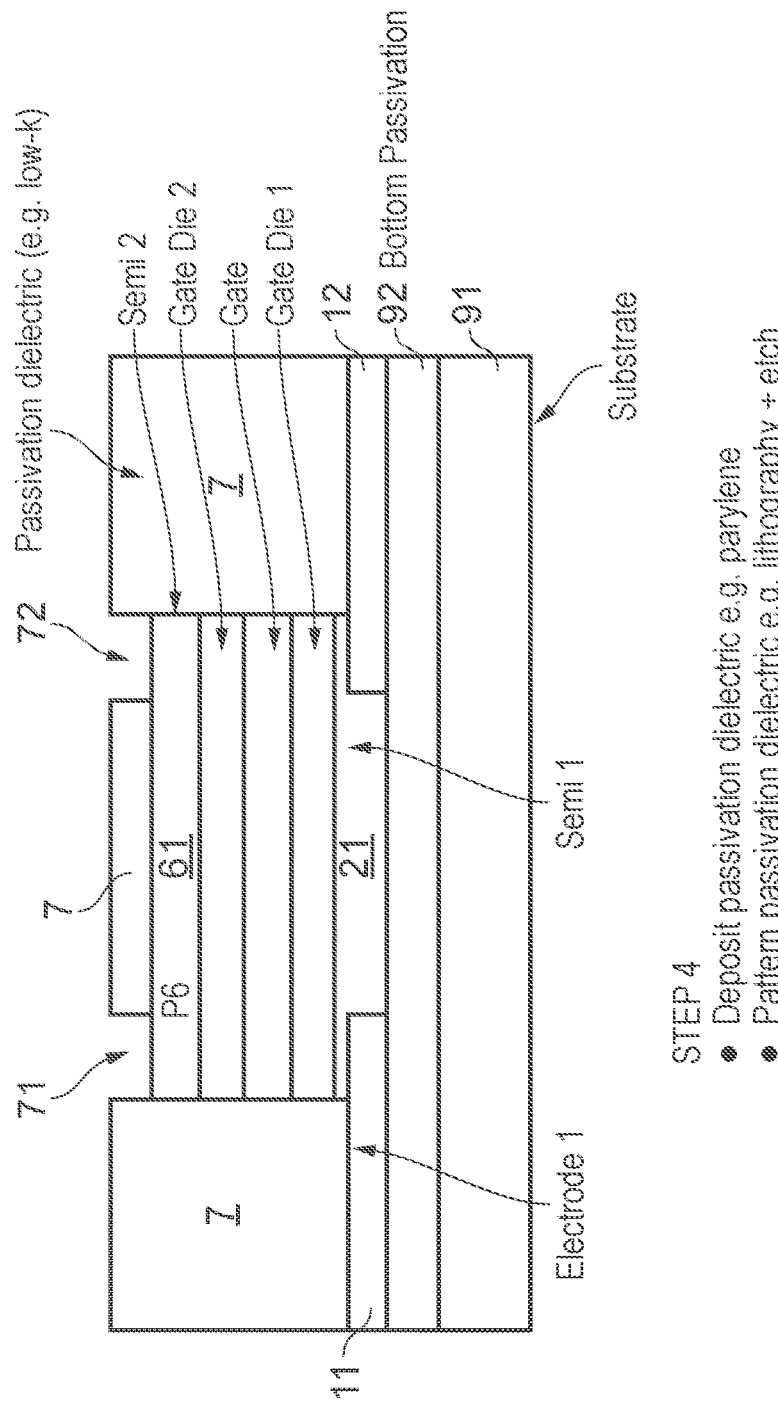
Figure 5:
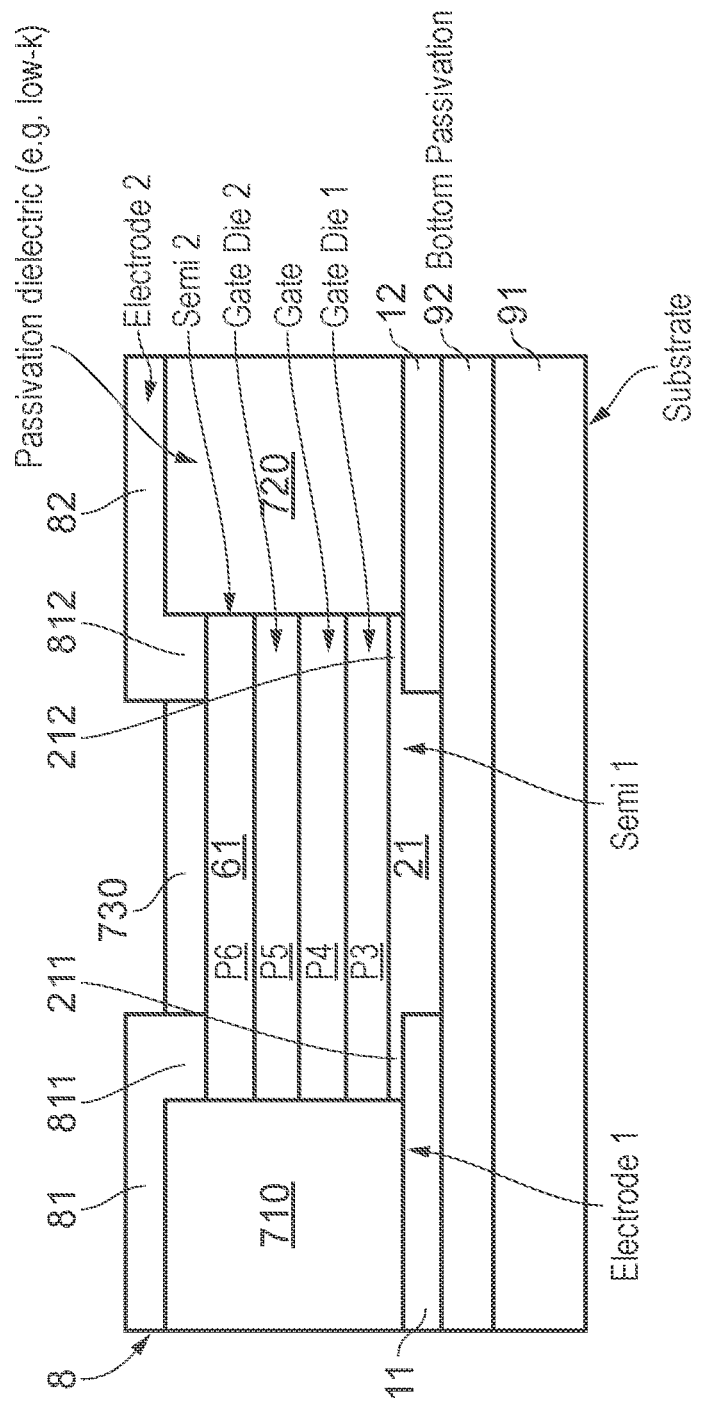
FIG. 5 illustrates an electronic structure embodying an aspect of the invention.
Figure 6:
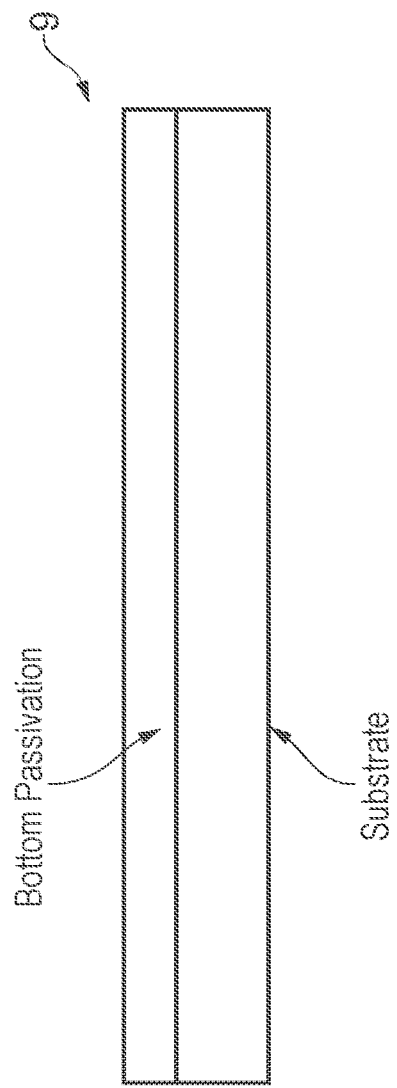
FIGS. 6-11 illustrate steps in another method embodying an aspect of the present invention.
Figure 7:
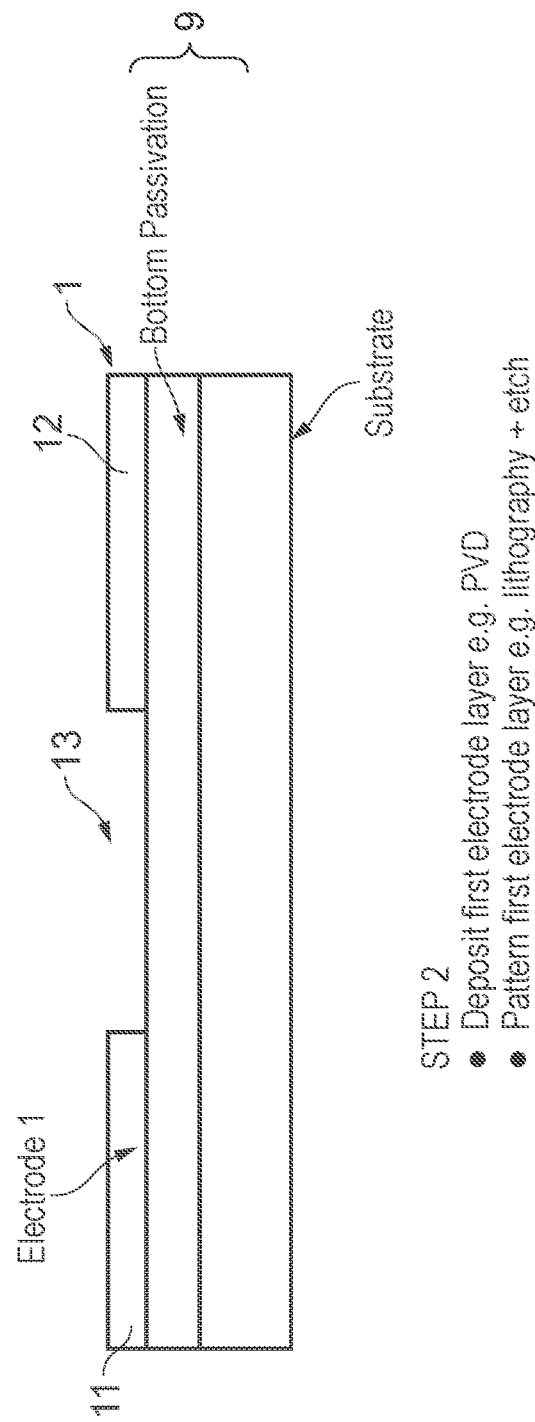

FIGS. 1-5 illustrate steps in a method embodying an aspect of the invention and resulting in the structure shown in FIG. 5, which itself is an electronic structure embodying an aspect of the invention. Referring to FIG. 1, the method comprises providing a support 9, which in this example is a multi-layer structure comprising a substrate 91 and a passivation layer 92 formed on the substrate. The passivation layer 92 may be referred to as a bottom passivation layer, as it will sit beneath the stacked FETs of the resultant structure. This providing of the support 9 may comprise sub-steps, such as preparing the substrate, which may for example be glass, silicone, plastic, or other suitable material depending on application, and which may be flexible in certain embodiments, or rigid. The passivation layer may be formed by depositing it on the substrate surface by any one of a wide variety of known deposition techniques. Although the support 9 in FIG. 1 comprises passivation layer 92, in certain embodiments the passivation layer may be omitted, so the deposition of a passivation layer is an optional step.

Figure 2:
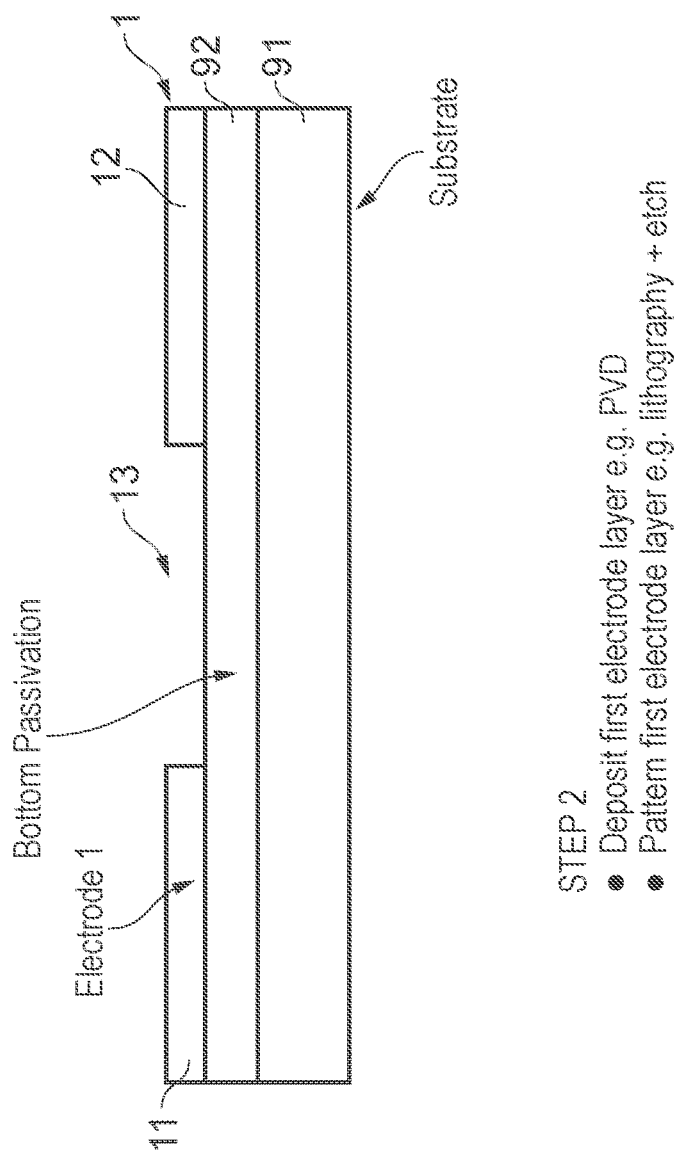

Referring now to FIG. 2, the method further comprises forming a first layer or body 1 of conductive material on the support 9, and then patterning the first layer or body 1 of conductive material to define a first source terminal 11, a first drain terminal 12, and a first gap 13 separating the first source terminal and the first drain terminal. It will be appreciated that the terms source terminal and drain terminal are interchangeable in this example, there being no technical or structural difference between the two terminals in this embodiment. The first layer or body 1 of conductive material may also be referred to as electrode 1, or a first electrode layer. The formation of the first layer or body 1 of conductive material may comprise depositing the first electrode layer by one of a number of suitable techniques, for example plasma vapour deposition (PVD). Clearly, this is merely one example, and embodiments may utilise other layer-forming or deposition techniques known in the art. The patterning of the first layer or body 1 of conductive material (i.e. the patterning of the first electrode layer) may also be achieved using one of a number of well-known techniques in the art, for example by lithography and etching.

Referring now to FIG. 3, the method further comprises forming a first layer or body 2 of semiconductive material covering the first source and first drain terminals 11, 12 and filling the gap 13 so as to provide a first semiconductive channel 21 connecting the first source terminal 11 to the first drain terminal 12. The method also comprises forming a first layer or body 3 of dielectric material over the semiconductive layer 2. The method further comprises forming a layer or body 4 of conductive gate material over the first layer or body of dielectric material 3, forming a second layer or body 5 of dielectric material over the conductive gate layer 4, and forming a second layer or body 6 of semiconductive material over the second layer or body of dielectric material 5. Typically, in methods embodying the invention the layers 2, 3, 4, 5, and 6 will initially cover all of the first source terminal 11 and first drain terminal 12.

The method then comprises patterning the layers 2-6 to uncover portions P11 and P12 of the first source 11 and first drain 12 terminals and produce a stack 62 comprising the first semiconductive channel 21, a portion P3 of the first dielectric layer, a portion P4 of the gate layer, a portion P5 of the second dielectric layer, and a portion P6 of the second semiconductor layer. It will be appreciated that, in this embodiment, each layer of the stack has the same projection onto a nominal horizontal plane, that nominal horizontal plane being generally the plane of the first electrode layer 1 for example. Thus, the various components of the stack are stacked in a nominal vertical direction. In this example, the portion P2 of the first semiconductor layer remaining after the patterning step overlaps both the first source terminal 11 and the first drain terminal 12. Thus, the first semiconductive channel 21 is arranged between the terminals 11 and 12, and the first overlapping portion 211 overlaps the first source 11, and a second overlapping portion 212 overlaps the first drain 12. In the figure the first semiconductor layer is also labelled as semi 1, the first dielectric layer is also labelled gate die 1, the gate layer 4 is also labelled gate, the second gate dielectric layer 5 is labelled gate die 2, and the second semiconductor layer 6 is also labelled semi 2. The first semiconductor layer may be deposited on the underlying structure using a variety of techniques, e.g. PVD. The first gate dielectric layer 2 may be deposited, or otherwise formed, by a variety of techniques, e.g. PVD. The gate layer may be deposited or otherwise formed by a variety of techniques, including, for example, PVD. The second gate dielectric layer 5 may be deposited or otherwise formed by a variety of techniques, including, for example, PVD. The second semiconductor layer may be deposited or otherwise formed by a variety of techniques, including, for example, PVD. The patterning of the layers 2-6 (i.e. the patterning of all layers from semi 2 to semi 1) can again be achieved using a variety of known techniques, for example lithography and etching.

Referring now to FIG. 4, the method further comprises forming a further layer or body 7 of dielectric material over the stack 62 to cover the stack and the previously uncovered portions P11 and P12 of the first source 11 and first drain 12 terminals. This forming of a further layer may take the form of depositing a passivation dielectric material, e.g. parylene. The method further comprises patterning the further layer or body 7 of dielectric material to form first 71 and second 72 windows through the further layer or body of dielectric material 7 to the stack portion P6 of the second semiconductor layer 6. This patterning of the further layer to form the windows may also be referred to as patterning the passivation dielectric, and may be achieved using a variety of known techniques, including, for example, lithography and etching.

Then, referring to FIG. 5, the method comprises forming a second source terminal 81 comprising conductive material 811 at least partially filling the first window, and a second drain terminal 82 comprising conductive material 812 at least partially filling the second window 72, such that the portion P6 of the second semiconductive layer 6 provides a second semiconductive channel 61 connecting the second source terminal 81 to the second drain terminal 82. The formation of the second source and drain terminals 81, 82 may comprise depositing a second electrode or electrode layer (electrode 2) (or, in other words, forming a layer or body of conductive material 8, for example by a variety of techniques, including PVD, and then patterning the second electrode layer 8 to remove a portion of that layer over the central portion of the passivation layer 730, so as to produce separate electrodes 81 and 82. The patterning of the second electrode layer 8 may be achieved using a variety of techniques, including, for example, lithography and etching.

The electronic structure resulting from the method, and illustrated in FIG. 5, is an electronic structure embodying the invention. It comprises a first FET comprising first source terminal 11, first drain terminal 12, first semiconductive channel 21, and gate P4 to which a voltage/potential may be applied to control conductivity of the channel 21. It also comprises a second FET comprising second source terminal 81, second drain terminal 82, second semiconductive channel 61, and the same gate P4 as the first FET. Thus, the two FETs are stacked and vertically aligned. In certain embodiments, the semiconductive material of first channel 21 may be N or P-type, and the semiconductive material of the second channel 61 may be of the opposite type. Thus, in certain embodiments the structure may comprise a complementary and symmetrical pair of N-type and P-type devices sharing a common gate P4.

The passivation dielectric material 7 may, in certain embodiments, be low-k material, and in alternative embodiments may be high-k material, depending on particular requirements.

It will be appreciated that the above steps described with reference to FIG. 3 can be split into multiple individual steps. Also, although the method is illustrated as including formation of bottom electrodes 11 and 12 and then forming of the first semiconductor layer 2 on top of those electrodes, alternative embodiments can utilise a top-contact design, in other words the first terminals 11 and 12 may be formed on top of a previously formed or deposited layer of semiconductive material 2, and then the further layers 3-6 of the stack 62 may be built up on top of those electrodes.

It will be appreciated that advantages provided by the structure of FIG. 5 include the advantage that the vertical stack results in a smaller circuit footprint, leading to higher yield and/or more dense circuits being achievable. It will also be appreciated that a substantial benefit of the method illustrated by FIGS. 1-5 are that the technique avoids processing on semiconductor/dielectric interfaces, resulting in reduced numbers of defects and/or better performance of the resultant transistors and circuits in which they are incorporated. In other words, the method illustrated by FIGS. 1-5 results in a structure comprising two stacked FETs, with their channel conductivities controlled by a single, common gate (sandwiched between them). The semiconductor/dielectric interfaces, after formation, are undisturbed. No subsequent processing is performed on them. They are therefore low in defects. The source and drain electrodes are generally on the opposite side of the semiconductor layers to the gate dielectrics, and are formed in the manner that does not require any disturbance or processing of the semiconductor/dielectric interfaces once formed.

It will also be appreciated that the structure shown in FIG. 5 also provides the advantage of reducing parasitic capacitances between the electrodes and the gate. This is achieved, at least in part, by the presence of the passivation dielectric material. Also, it will be appreciated that the portions 811 and 812 of the second source and drain electrodes which fill the windows 71, 72 through the passivation layer can be regarded as conductive vias connecting the portion P6 of the second semiconductor layer to the remaining portions of the second source and drain electrodes 81, 82. Thus, the passivation material separates the bulk of the second source and drain electrodes 81 and 82 from the gate P5, reducing parasitic capacitances between them.

Figure 8:
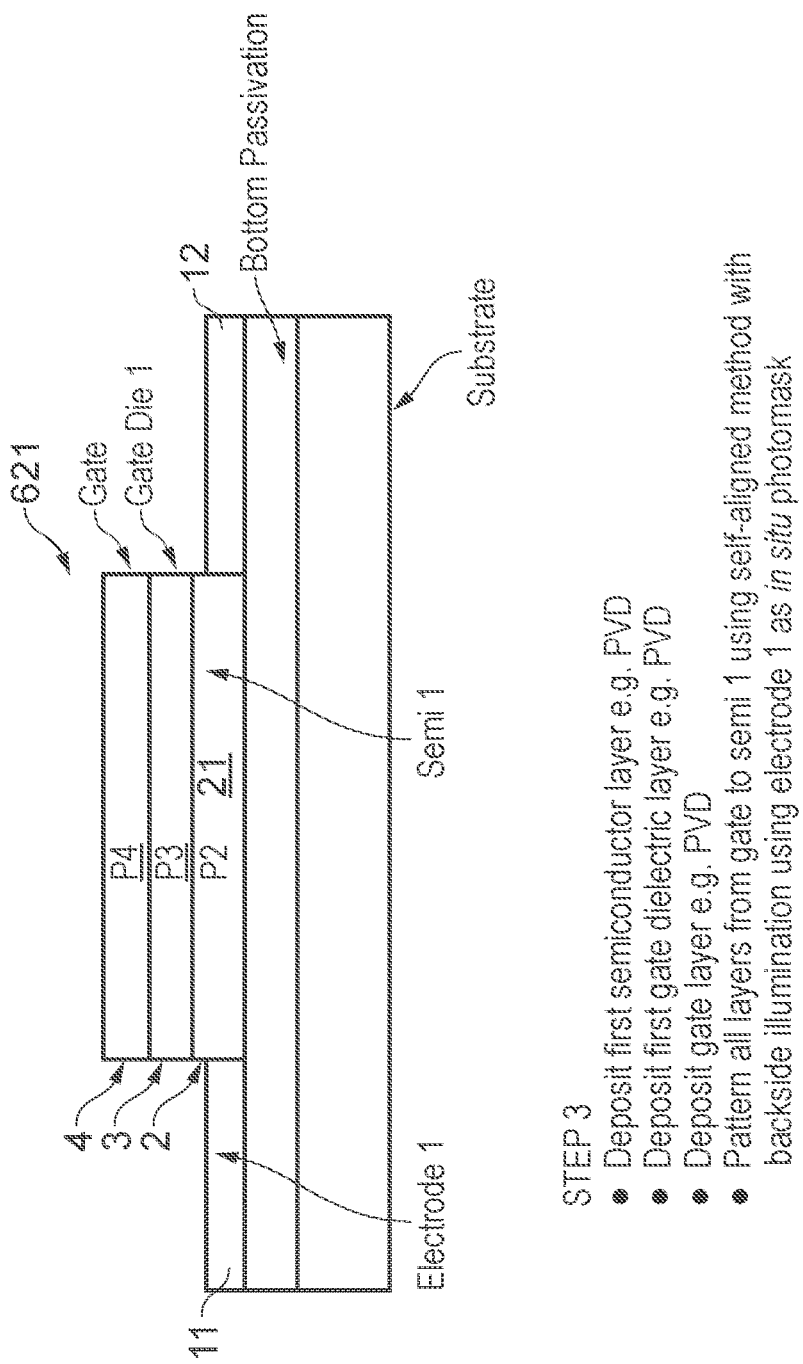
Figure 9:
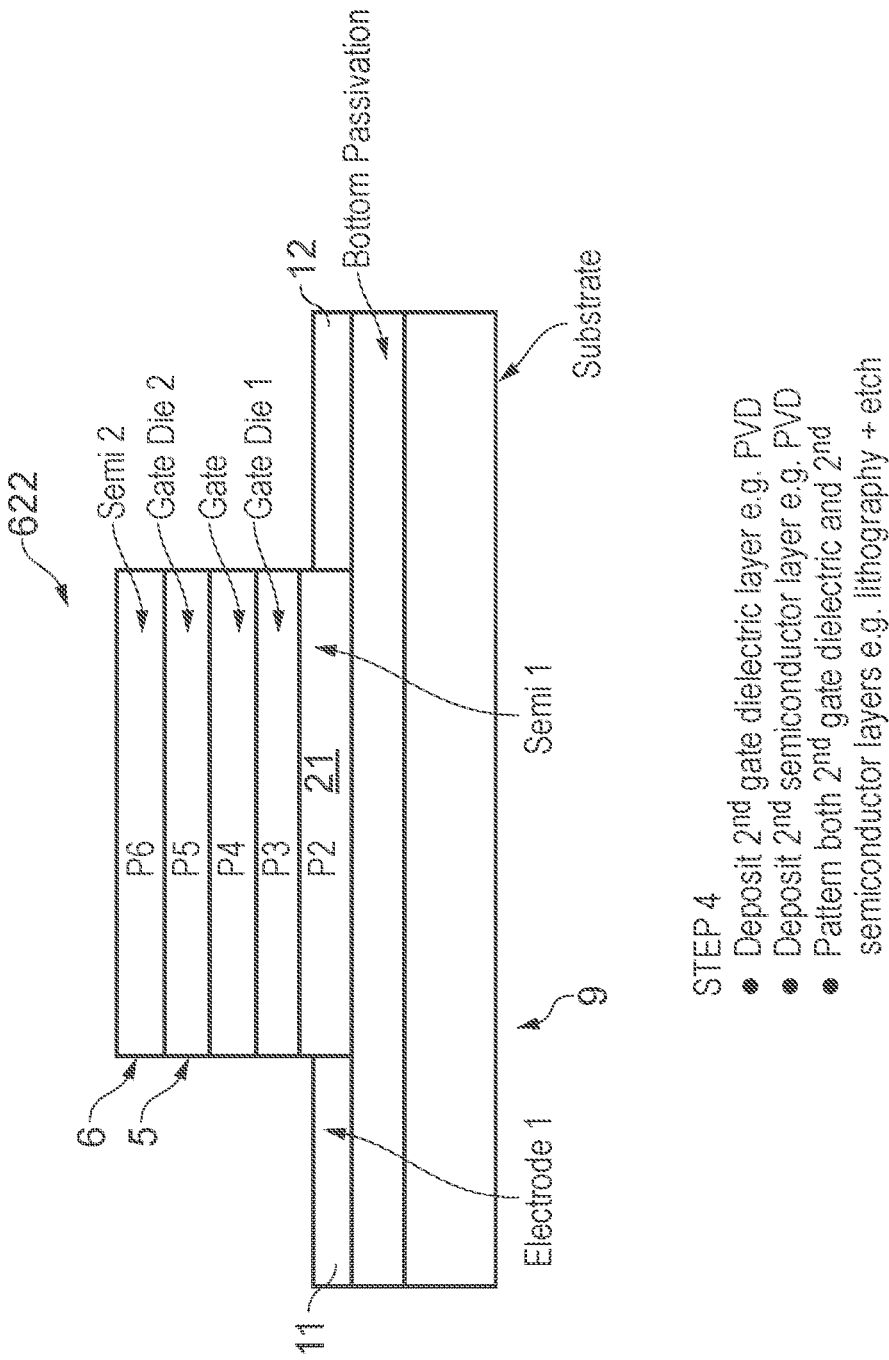
Figure 10:
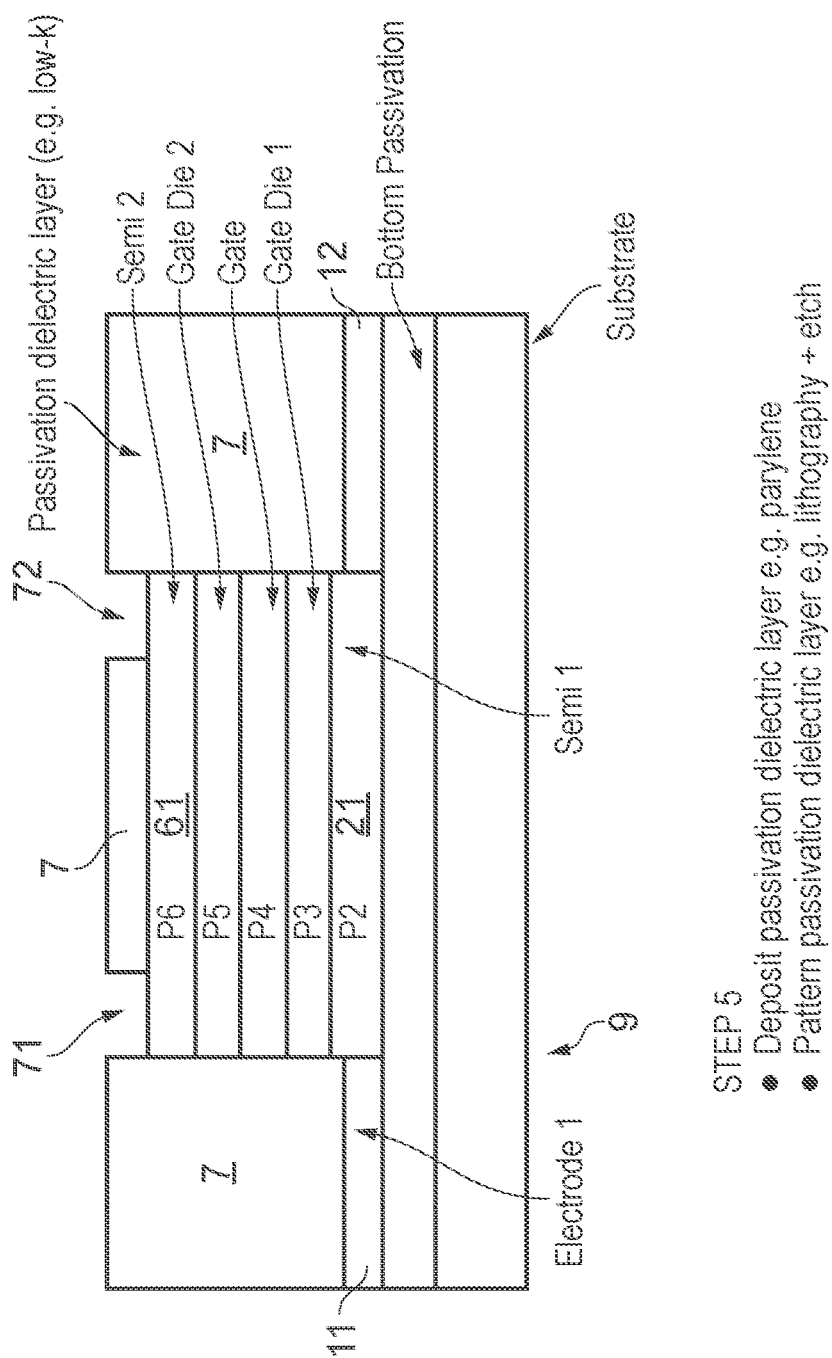
Figure 11:
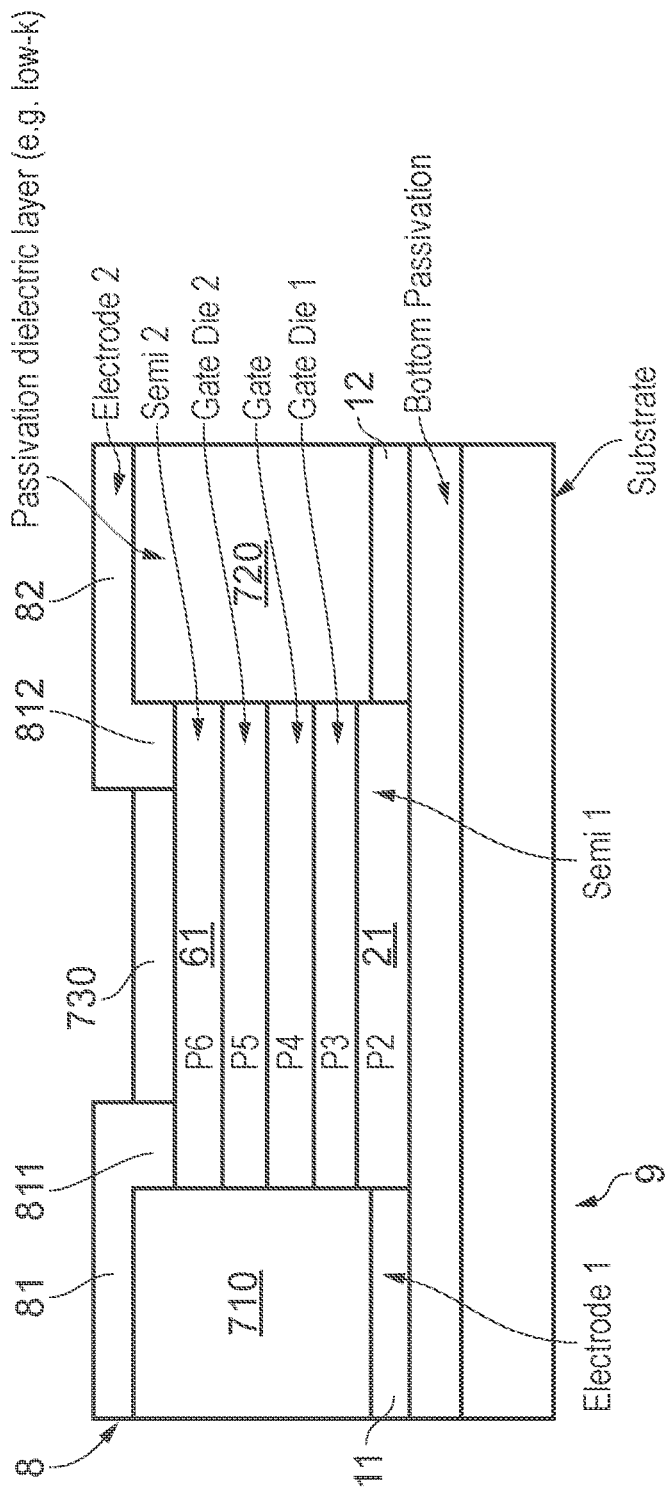
Figure 32:
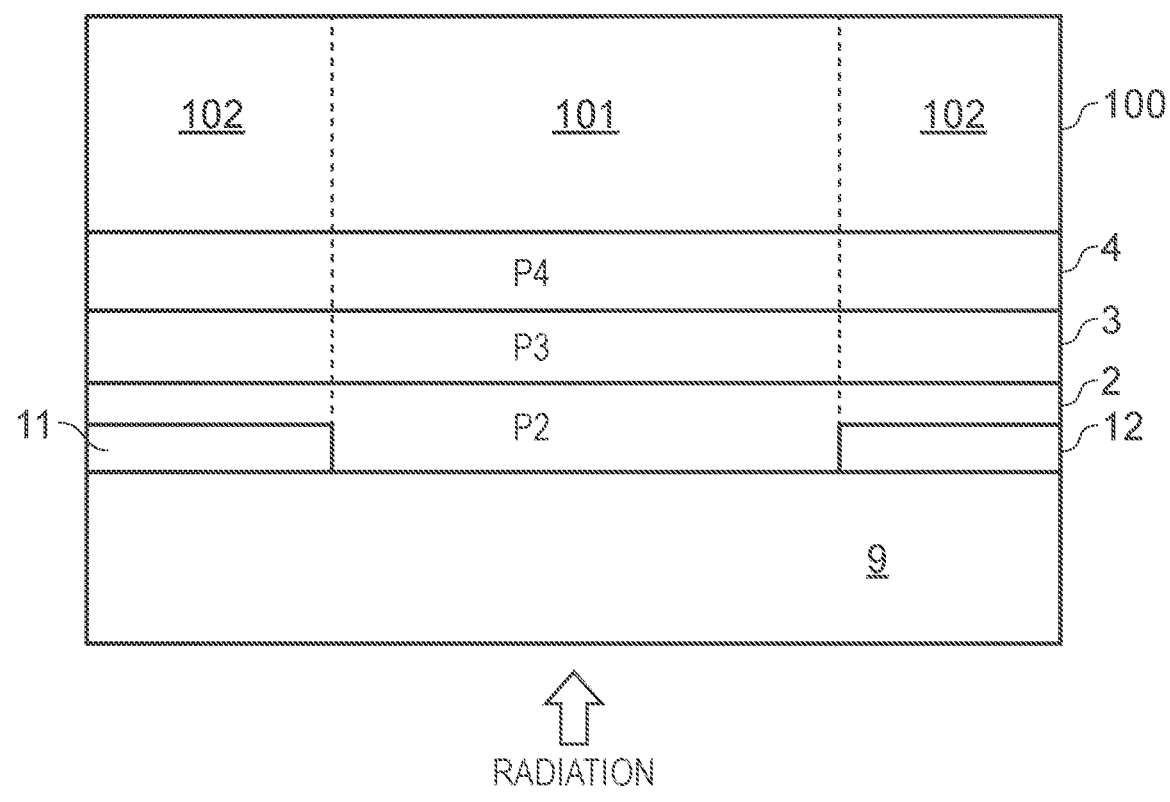
FIG. 32 illustrates a patterning method useable in embodiments of the invention.

Referring now to FIGS. 6-11, these illustrate steps in another method embodying an aspect of the invention and suitable for producing an electronic structure embodying an aspect of the invention, as shown in FIG. 11. Referring first to FIG. 6, the method again comprises providing a support 9. Moving on to FIG. 7, electrodes 11 and 12 are then formed on the support by any suitable technique, for example by PVD followed by patterning such as lithography and etching. Referring then to FIG. 8, first semiconductor, first gate dielectric, and gate layers or bodies (2, 3, 4 respectively) are formed on the structure of FIG. 7 by suitable techniques (e.g. by PVD) and then patterned to produce a first stack 621 comprising portions P2, P3 and P4 of those layers 2, 3, and 4 respectively. In this example, it will be appreciated that the patterning of those layers 2, 3, and 4 have been performed such that the first stack 621, and indeed its lowermost layer which is portion P2 of the first semiconductor layer 2, does not overlap either the electrodes 11, 12. Advantageously, this reduces parasitic capacitances. In certain embodiments, this accurate alignment, to avoid overlap between the gate P4 and the first electrodes 11, 12 may be achieved using a technique as illustrated in FIG. 32. Referring to FIG. 32, the layers to be patterned (in this example layers 2, 3, and 4) are shown, formed over the electrode structure comprising electrodes 11 and 12, supported by the support structure 9. At the stage illustrated in FIG. 32 the layers are as yet unpatterned. A layer of resist material 100 has been formed on top of the layers to be patterned. To pattern the layers, the structure is illuminated from underneath (in the figure) with radiation of suitable wave length (e.g. UV radiation) taking into account the properties of the resist material 100. The support 9 and layers 2, 3 and 4 in this example are substantially transparent to the radiation, whereas electrodes 11 and 12 are opaque. The electrodes 11 and 12 thus act as an in-situ photo mask, such that a central portion 101 of the photo resist layer is exposed to the radiation, whereas portions 102 above the electrodes 11, 12 are unexposed. After this exposure, the structure is processed and developed using techniques well-known in the art to first remove the unexposed portions 102 of the photo resist layer 100, then remove the underlying portions of the layers 2, 3, and 4, and then the remaining exposed portion 101 of the layer 100 is removed, leaving the aligned stack comprising the central portions P2, P3 and P4 of the patterned layers.

Referring now to FIG. 9, after forming the aligned first stack 621, the method further comprises forming the second gate dielectric layer 5 and second semiconductor layer 6 on top of the stack (e.g. by PVD) and patterning both of those layers 5 and 6 by suitable techniques (e.g. by lithography and etching) to produce a resultant aligned second stack 622 comprising those portions P2-P6 of the various layers formed on the electrode/support underlying structure. It will be appreciated that if a reverse side illumination technique is used to produce the aligned first stack 621, then the support 9 and layers 2-4 must each be at least substantially transparent to the radiation being used to expose the photo resist. However, if the reverse exposure technique is only used to pattern those layers 2-4, and not layers 5 and 6, then the choice of materials for layers 5 and 6 becomes wider; they are not required to be substantially transparent to the UV radiation. Thus, the techniques illustrated by FIG. 9 are suitable for manufacturing embodiments in which layers 5 and 6 are of non-transparent material.

Referring now to FIG. 10, as with the embodiment described with reference to FIG. 4, a passivation dielectric layer or body (e.g. of low-k material, or of high-k material) is formed over the second stack 622 and exposed/uncovered portions of the first electrodes 11 and 12, and this passivation dielectric material may be formed by a variety of techniques, including deposition. In certain embodiments the passivation dielectric layer may be formed from parylene. Then the passivation dielectric layer is patterned, for example using lithography and etching, to form windows 71 and 72 through to the portion P6 of the second semiconductor layer 6. Then, referring to FIG. 11, the second electrodes 81 and 82 are formed, each comprising a respective via 811, 812 passing through the passivation dielectric material 7 and contacting an upper surface of the portion P6 of the second semiconductor layer 6. The electrodes may be formed by techniques previously described. It will be appreciated that the second electrodes 81, 82 may be formed by a variety of techniques well-known in the art, for example by lithography and etching, but can also, in certain embodiments, be produced by a self-aligned technique by repeating rear-side illumination process if the gate material is transparent, i.e. if the first electrode layer comprising electrodes 11 and 12 locks UV light but the gate lets the UV through to define a window. This window may then be used to define self-aligned vias within the passivation dielectric into which a material to produce the second electrodes 81 and 82 is deposited. Combined with a low-k passivation dielectric this can minimise the impact of the second electrodes 81, 82 on the gate, thus minimising parasitics. This self-aligned technique, employing rear-side illumination, is explained in more detail below with reference to FIGS. 12-18.

It will be appreciated that the above-described method of producing a structure in accordance with FIG. 11 provides the advantages of reduced defects, and smaller circuit footprint. It will also be appreciated that whilst the reverse side illumination technique was used to produce a self-aligned first stack 621 of just layers 2, 3 and 4, in alternative embodiments a similar technique could be used to pattern all of layers 2-6. In such embodiments, each of layers 2-6 is required to be transparent to the wavelength being used to interact with the photo resist. Then, rather than patterning layers 2-4 to form a first stack before then depositing layers 5 and 6, all of layers 2-6 may be deposited before patterning. The reverse side illumination technique may then be used as described with reference to FIG. 32 to produce an aligned stack comprising portions P2-P6.

Referring now to FIGS. 12-18, these show how a technique involving reverse exposure may be used to produce self-aligned electrode vias connecting to the upper semiconductor layer.

Figure 12:
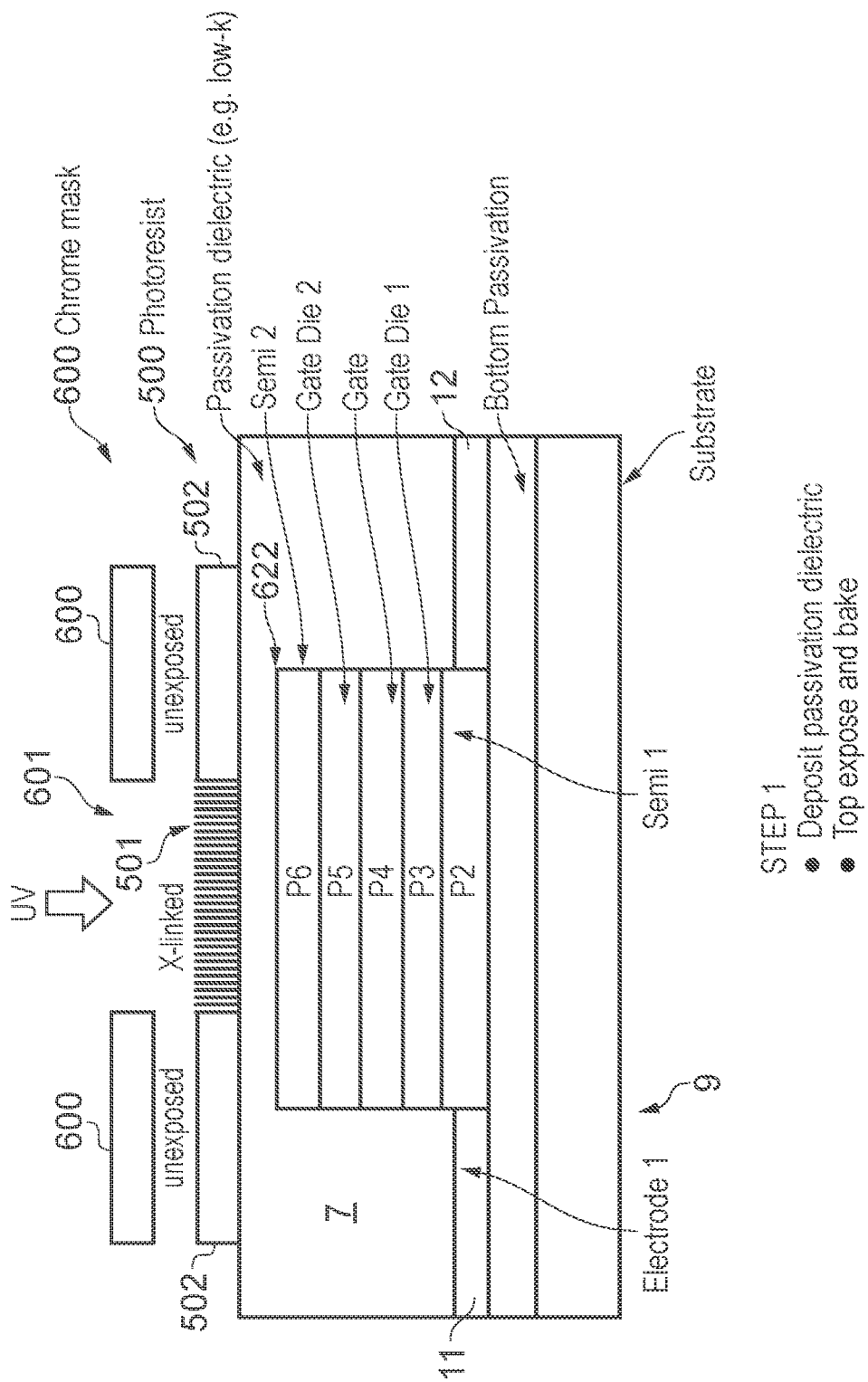
FIGS. 12-18 illustrate further steps which may be incorporated in certain methods embodying an aspect of the present invention to produce electronic structures embodying an aspect of the invention.
Figure 13:
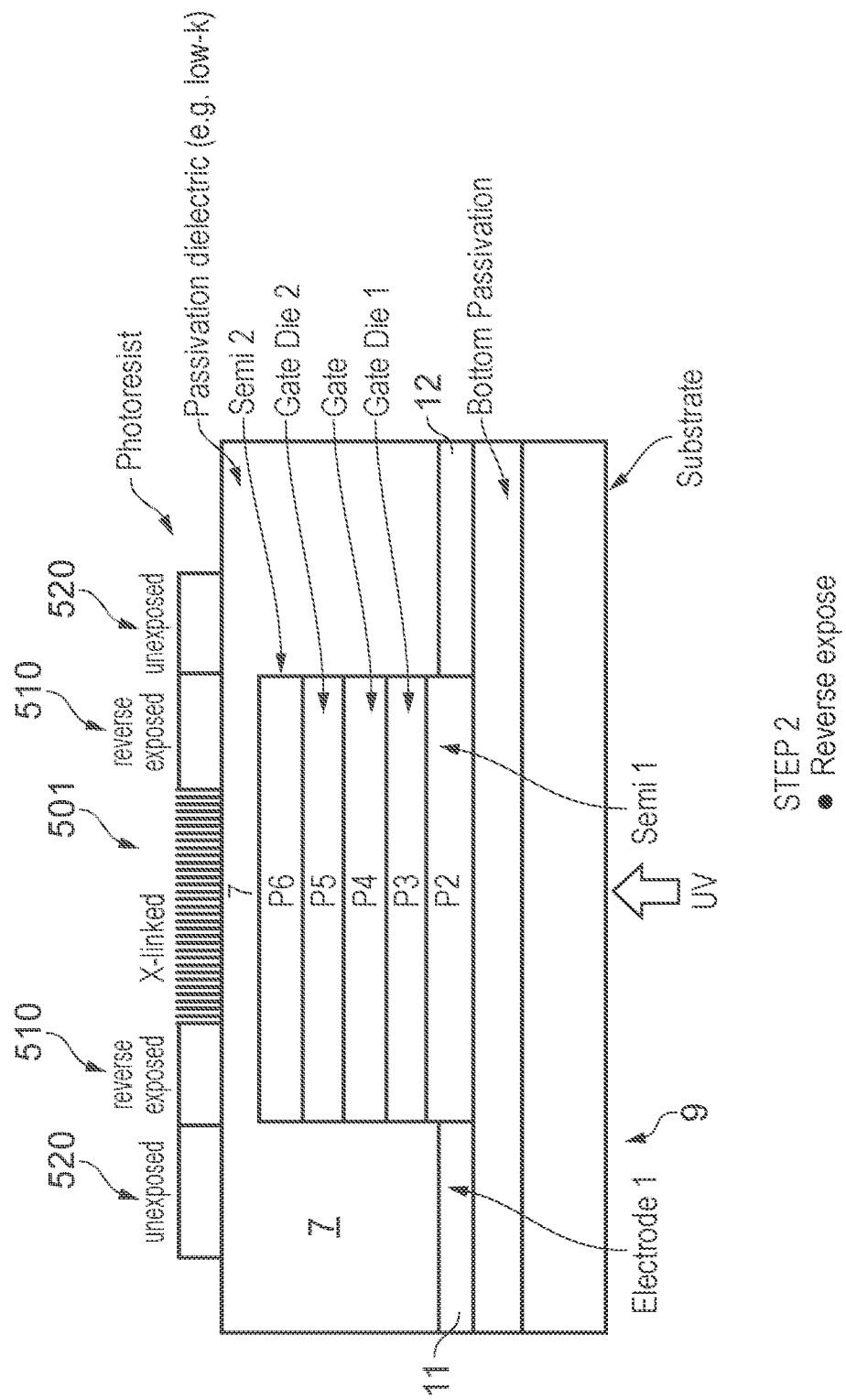

Referring now to FIG. 12, a second aligned stack 622 has been produced as described above, and a passivation layer 7, e.g. of low-k material, has been formed over the stack and the first electrodes 11, 12. A layer of photo resist material 500 has been formed on top of the structure (in this example on top of an upper surface of the passivation material 7 and that layer of photo resist 500 has been exposed to UV radiation through a chrome mask 600 having a window 601 positioned over the stack but having a projection onto the horizontal plane smaller than each of the stack layers. This results in essential portion 501 of the photo resist layer 500 being exposed to UV radiation, but portions 502 of photo resist remaining unexposed, shielded by the chrome mask 600. The photo resist may be formed on the dielectric 7 by a variety of techniques, including deposition, for example. Thus, the photo resist has been exposed from the nominal top, and the resultant structure is then suitably processed (e.g. by baking at an appropriate temperate for an appropriate length of time to cross-link the exposed photo resist material, making it resistant to developer. Then, referring to FIG. 13, the reverse surface is then exposed to UV radiation (in other words the structure is now exposed to radiation from below (a reverse exposure)). With suitable materials having been used for the various layers, the UV light is able to pass through each of the layers 2-6 and 7 but is unable to pass through the electrodes 11 and 12. Thus, the first electrodes 11, 12 act as in-situ photo masks and shield portions 520 of the photo resist from the radiation. Unshielded portions 510 of the photo resist layer are thus reverse exposed to UV radiation. The central cross linked portion 501 is also exposed to radiation. However, that central portion 501 is already cross-linked and does not soften. The reverse exposed portions 510 do soften, however.

Figure 14:
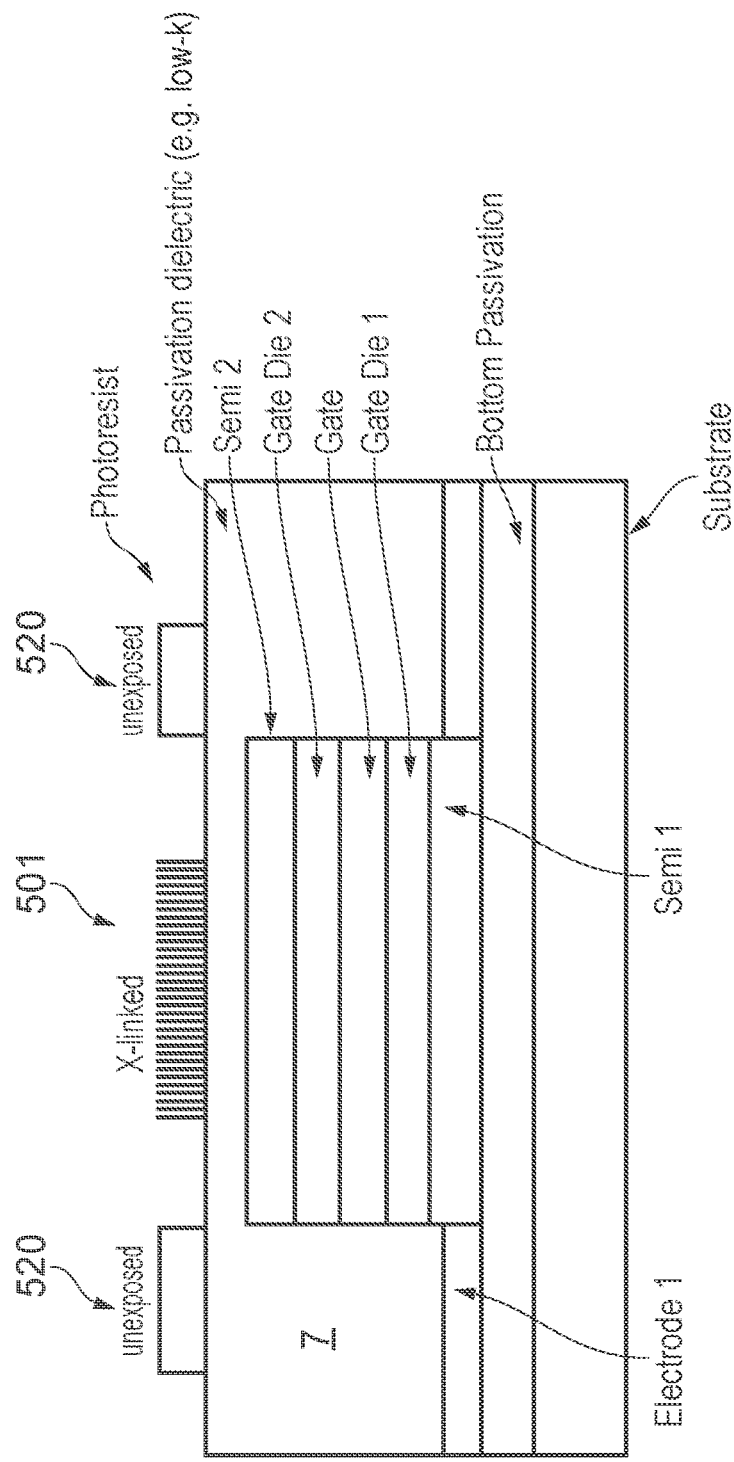
Figure 15:
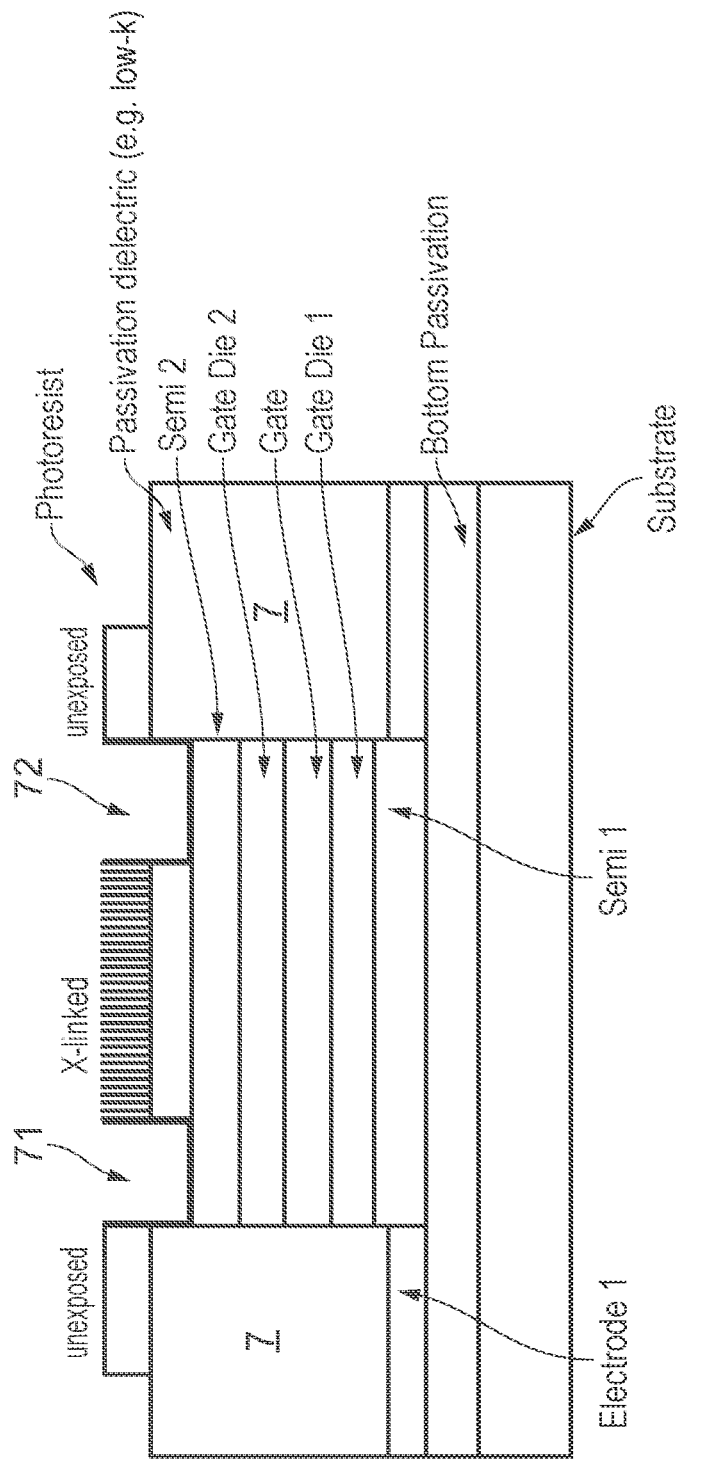
Figure 16:
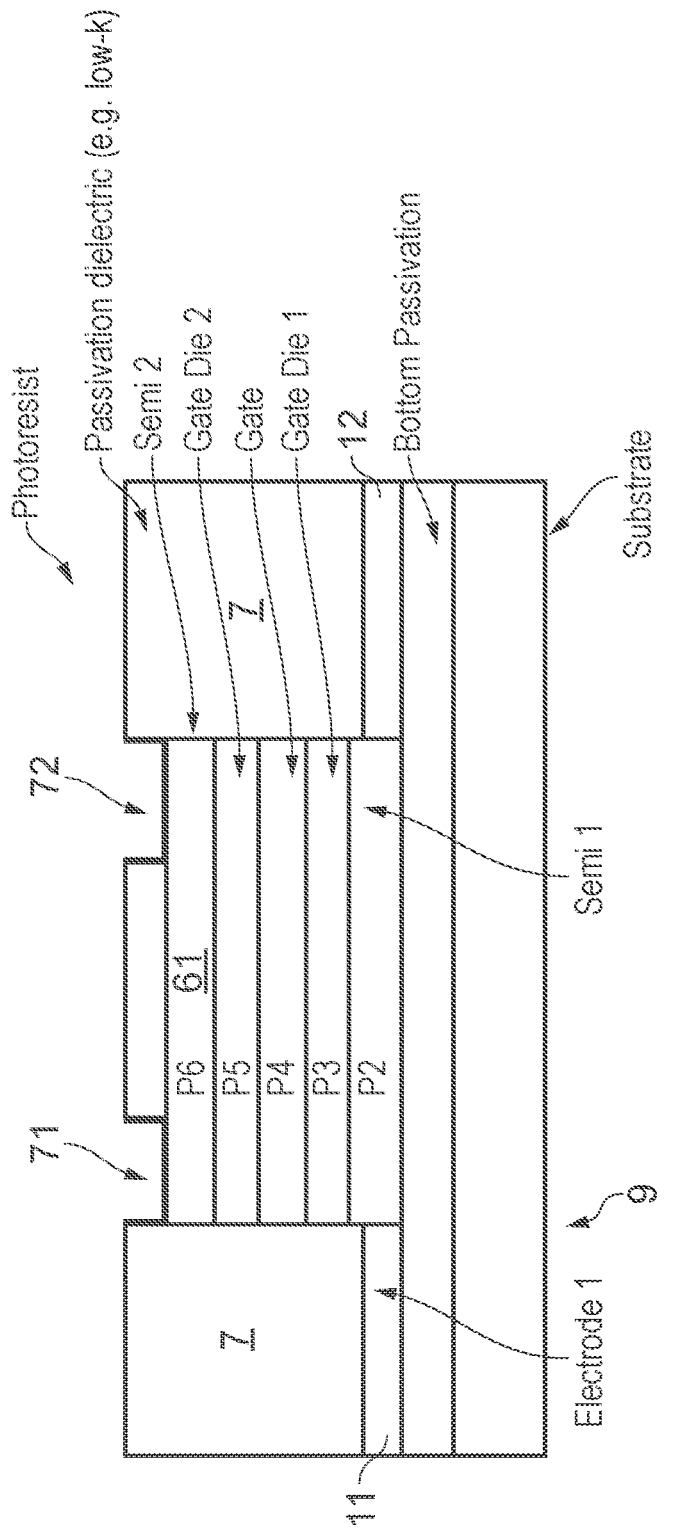
Figure 17:
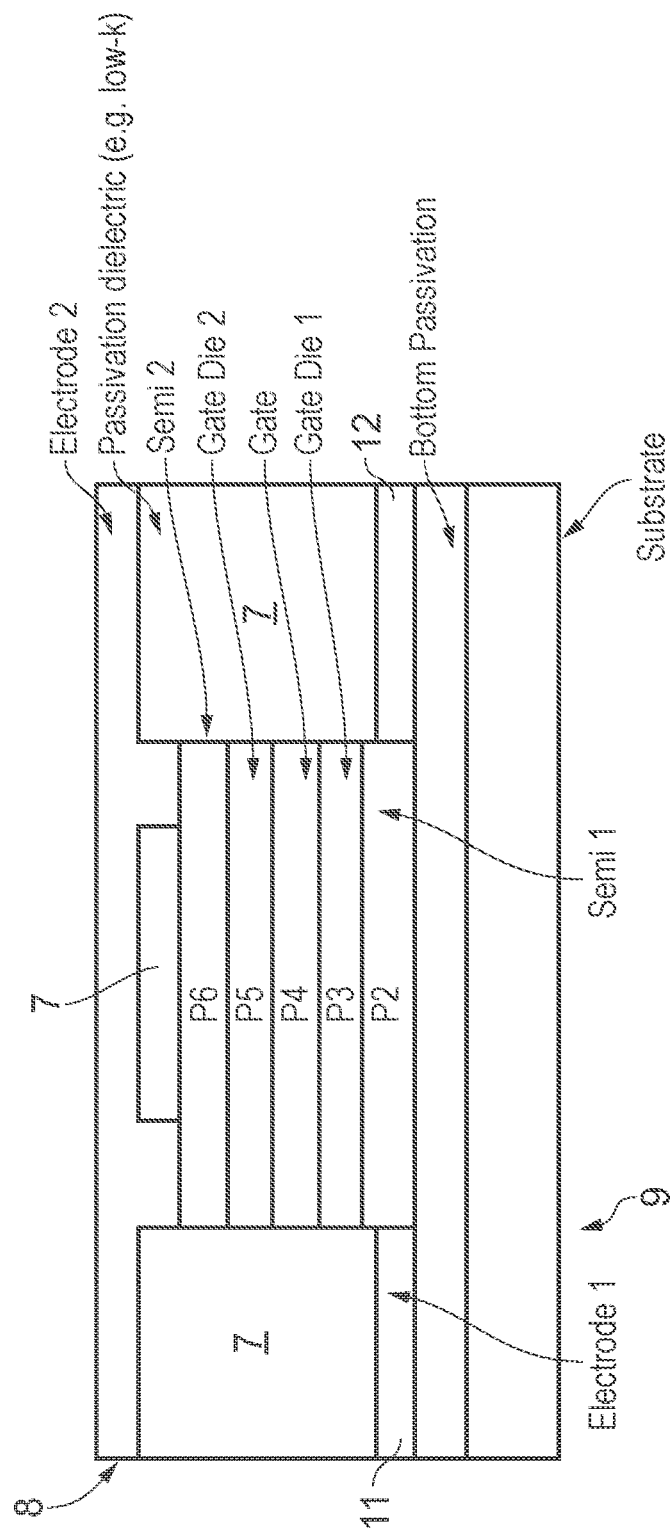
Figure 18:
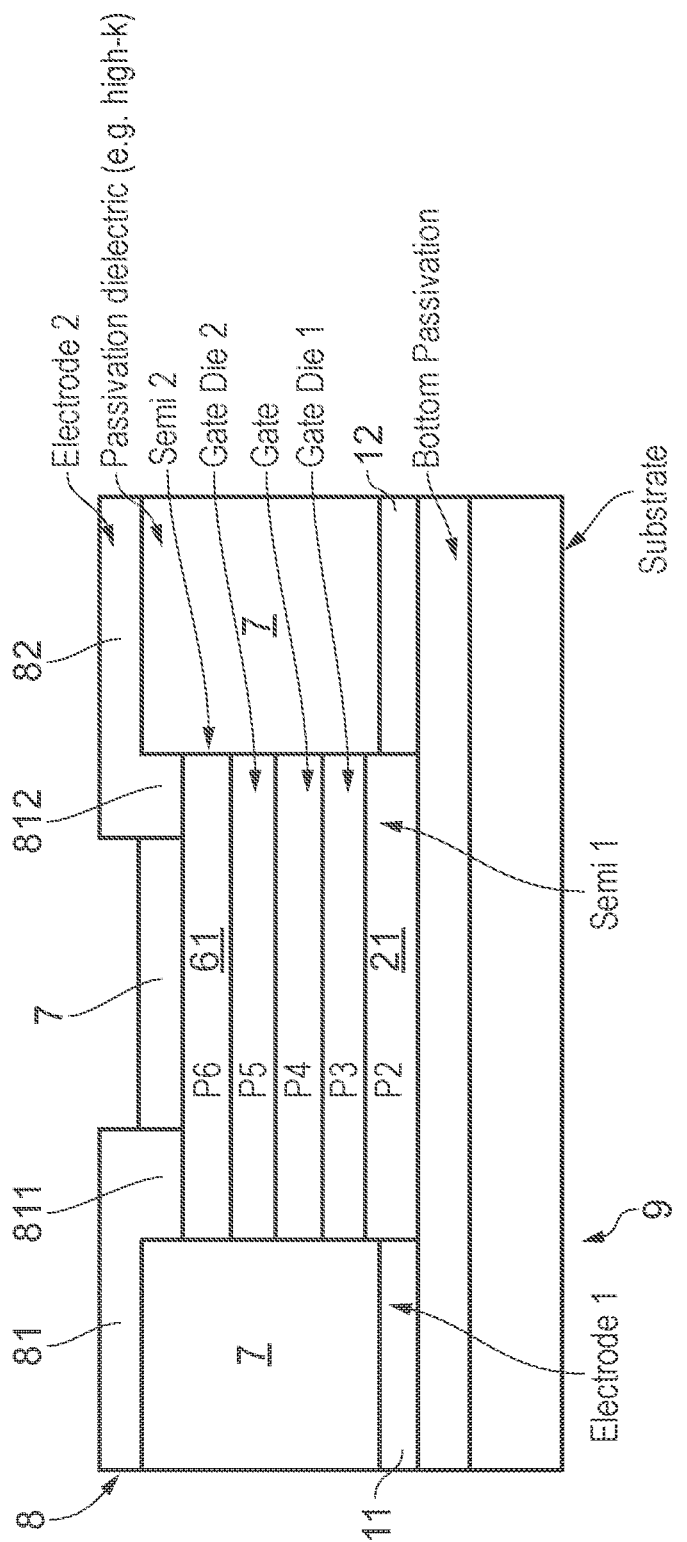

Referring now to FIG. 14, in a new step the photo resist material is now developed and the cross linked and unexposed portions of photo resist remain in place, whereas the reverse exposed portions are removed. Next, as shown in FIG. 15, the structure is further processed to remove dielectric material that was located underneath the reverse-exposed portions of photo-resist. A variety of suitable techniques may be used for this purpose, for example etching, and this results in the formation of windows 71 and 72 through the passivation layer to the underlying semiconductor material. Then, as shown in FIG. 16, the remaining photo resist material may be removed by suitable technique (e.g. by resist stripping), and then a top layer of conductive material may be formed over the remaining passivation material and at least partly filling the windows 71 and 72 to form conductive vias connecting to the second semiconductor layer. Finally, as shown in FIG. 18, the top electrode layer may be patterned to yield the final structure comprising separate second electrodes 81 and 82 as shown in FIG. 18. As mentioned above, the absence of any overlap between the gate and first electrodes 11, 12 in the structure of FIG. 18 results in low parasitic capacitances, as does the fact that the second electrodes 81 and 82 are separated from the gate material by passivation dielectric 7 and connect to the upper semiconductor layer only through the vias 811, 812.

Figure 19:
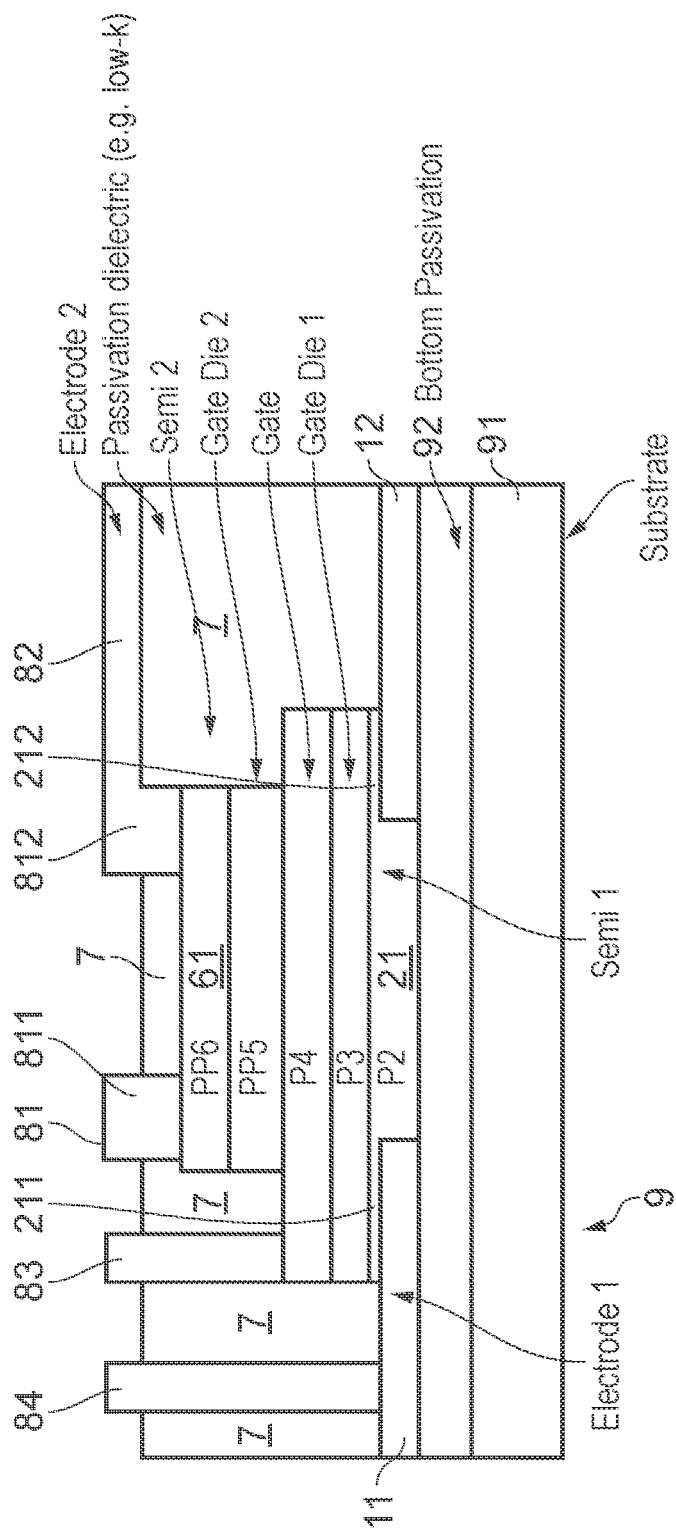
FIG. 19 illustrates another electronic structure in accordance with an aspect of the invention.

Referring now to FIG. 19, this illustrates another structure (electronic structure) embodying an aspect of the present invention. This structure is similar to the structure illustrated in FIG. 5 and again comprises first and second FETs arranged in a vertically stacked configuration, and sharing a common gate P4. However, in this embodiment the second gate dielectric portion PP5 and second semiconductor layer portion PP6 (which provides the second semiconductive channel 61) are not exactly aligned with the underlying gate P4, first gate dielectric P3, and first portion of semiconductor P2. Instead, the second semiconductor portion PP6 and second gate dielectric PP5 have the same footprints as one another (i.e. projections onto a nominal horizontal plane) but that footprint or projection is smaller than that of the gate and first gate dielectric. In other words, the arrangement is such that there is at least one portion of the gate P4 that is not covered by the second gate dielectric PP5 and second semiconductor layer PP6. Advantageously, that difference in size or extent of the gate from the overlying layers PP5 and PP6 of the stack enables a gate via 83 to be provided, forming a connection through the passivation layer 7 and connecting to the gate. Similarly, at least a portion of the first electrode 11 is not covered by the gate P4, and a further via 84 is formed through the passivation layer 7, to make electrical connection to the terminal 11.

Generally, the structure shown in FIG. 19 is manufactured using a method similar to the illustrated with reference to FIGS. 1-5. A difference, however, is that after depositing the gate layer 4, the method does not immediately proceed to depositing layers 5 and 6. Instead, after depositing layer 4, layers 4, 3, and 2 are first patterned so as to have a first extent or footprint over the underlying support. Then, the second gate dielectric 5 and second semiconductor layer 6 are deposited, then patterned separately from layers 2, 3 and 4, to produce the illustrated stack structure, that is a stack not having uniform cross section, footprint, or extent, but instead being stepped. The lower portion of the stack has a first extent or footprint, and the upper portion of the stack (comprising portions PP5 and PP6 has a smaller extent (i.e. a reduced footprint). After formation of the stepped stacked structure, the passivation dielectric 7 is formed and then patterned to open vias to the second semiconductor portion PP6, the gate P4, and at least one of the first electrodes 11 all at the same time. These vias may then be filled in a single processing step, where conductive material is deposited inside them and over the passivation layer 7. That conductive material may then be patterned as appropriate.

A method of producing the structure shown in FIG. 19 will now be described in more detail with reference to FIGS. 20-25.

Figure 20:
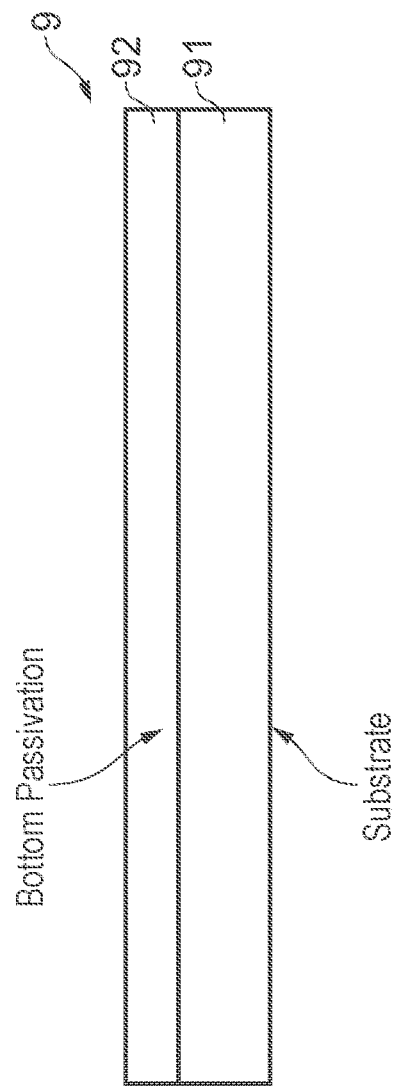
FIGS. 20-25 illustrate steps in a method embodying an aspect of the invention and suitable for manufacturing an electronic circuit in accordance with FIG. 19.
Figure 21:
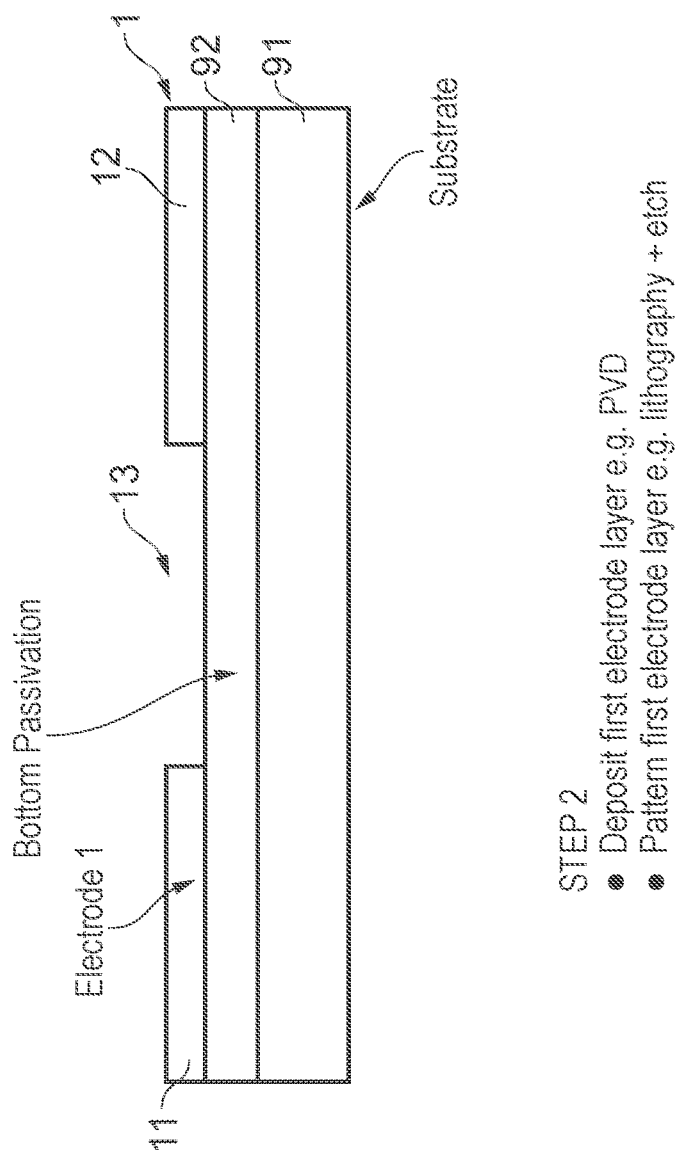
Figure 22:
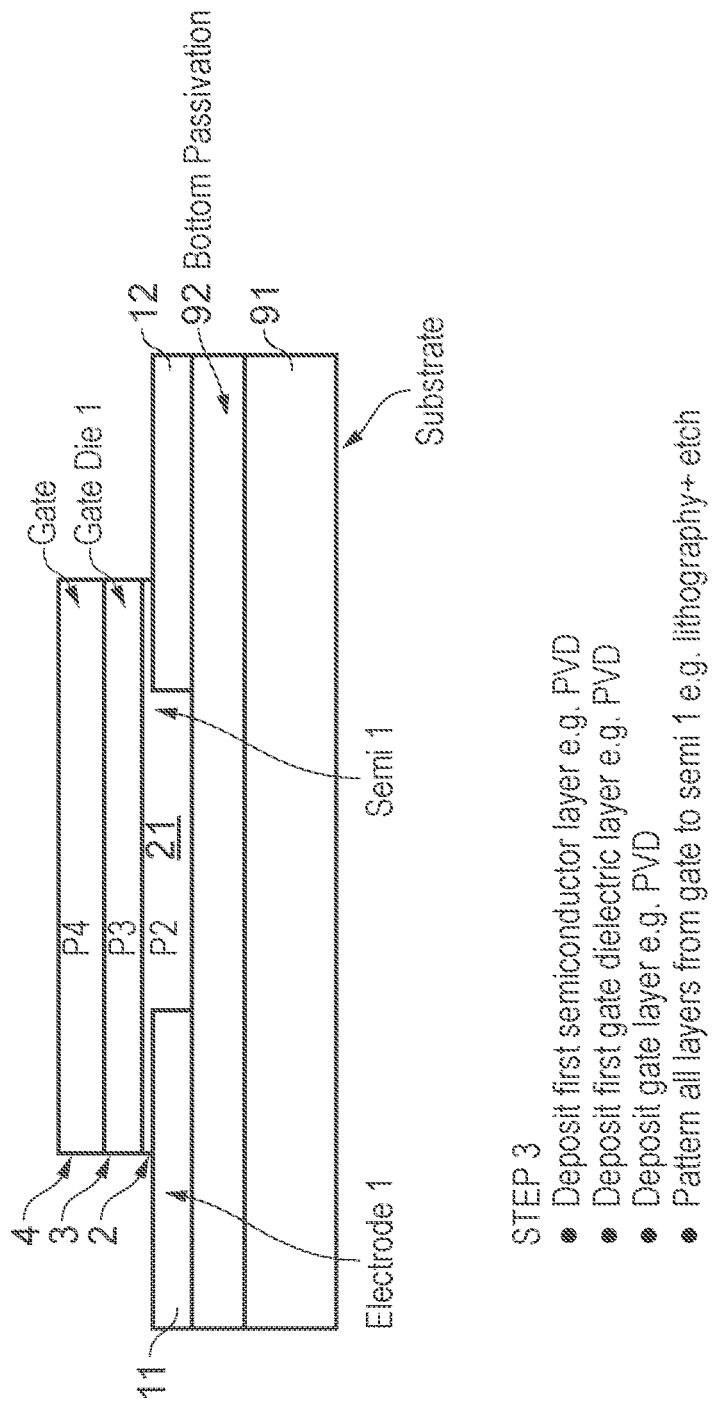
Figure 23:
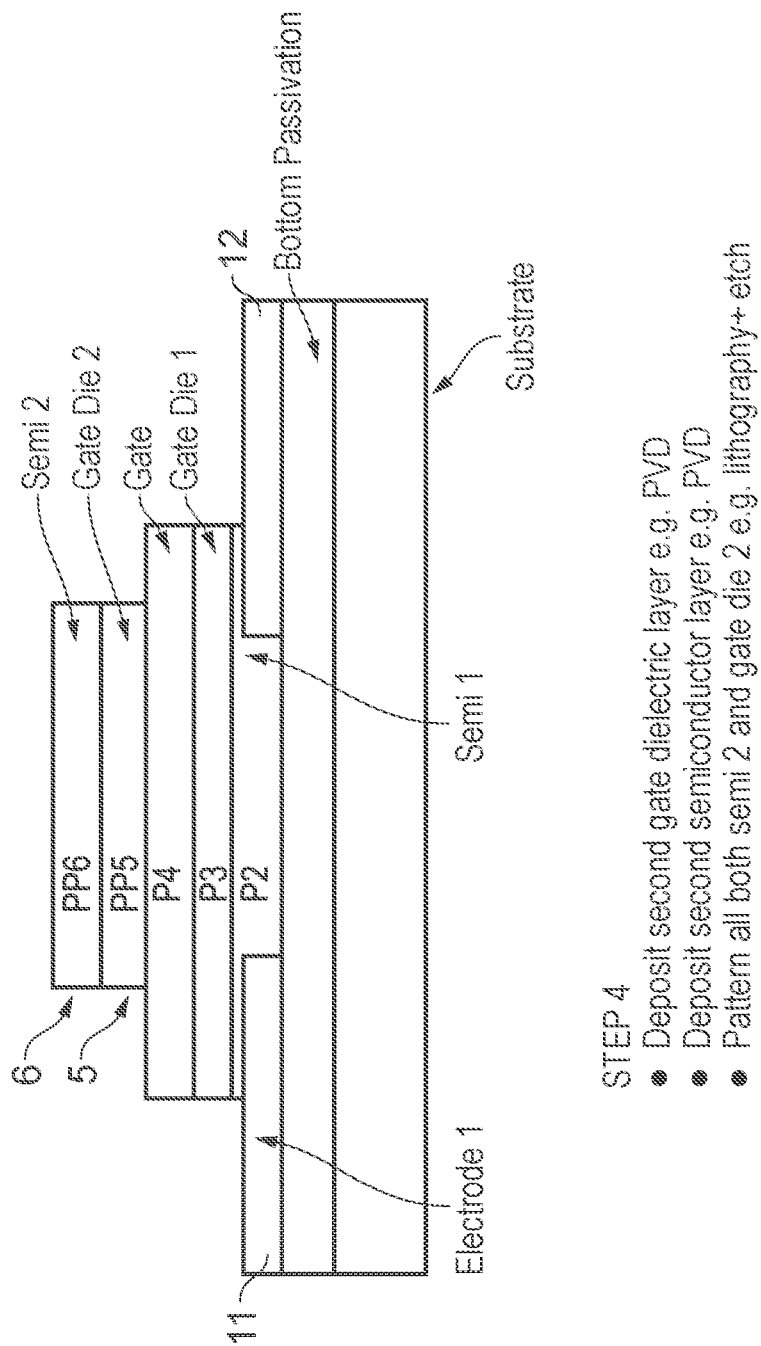
Figure 24:
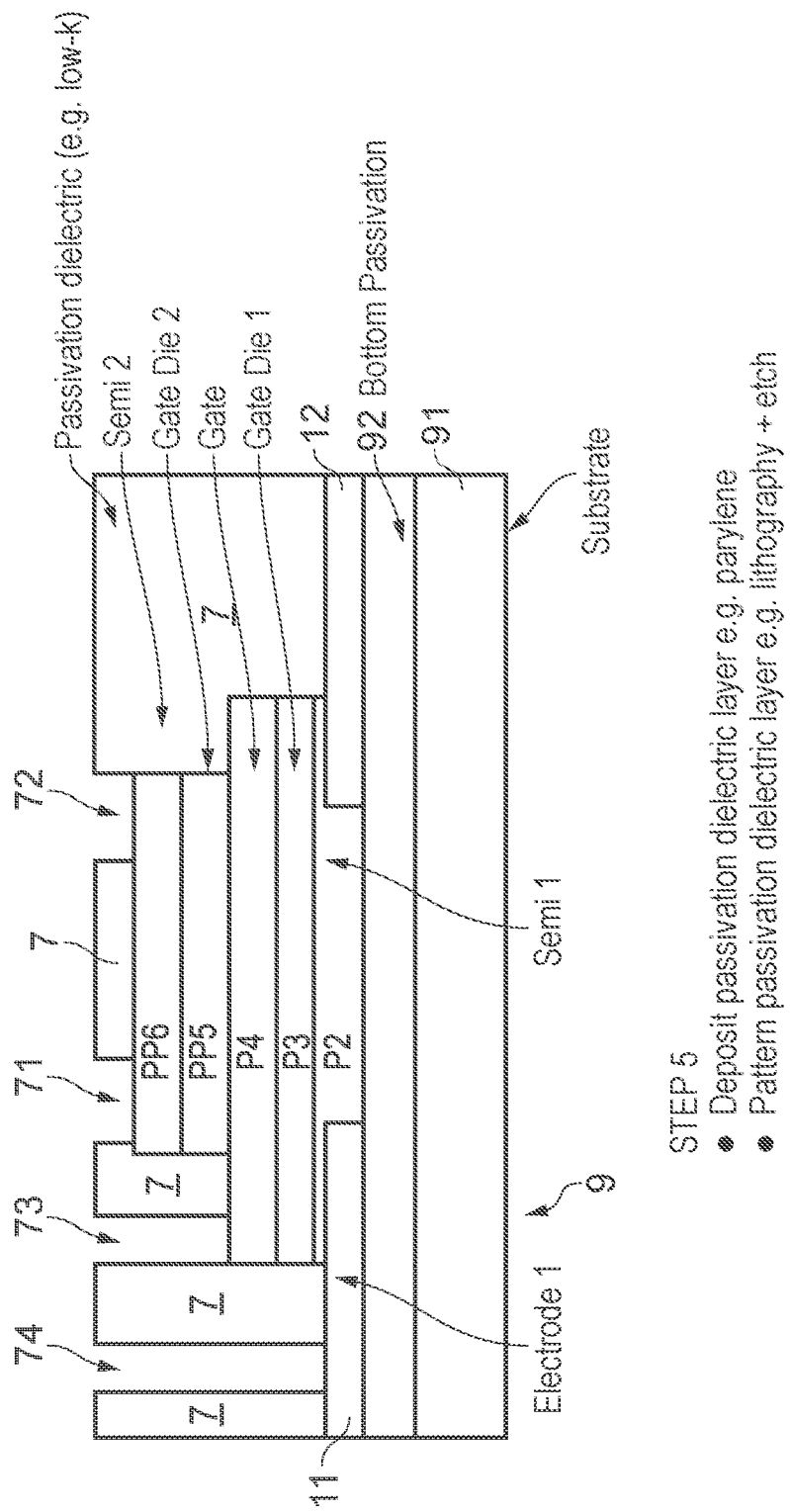

Referring now to FIG. 20, a support is provided in the same manner, or in a similar manner, as described above. Referring to FIG. 21, a first conductive layer or body 1 is formed and then patterned to provide first electrodes 11 and 12 separated by gap 13. Then, a first semiconductor layer or body, a first gate dielectric layer or body, and a gate conductor layer 3 are deposited and then patterned, for example, using lithography and etching, to produce the stacked structure illustrated in FIG. 22, leaving portions of the first electrodes 11, 12 exposed (i.e. uncovered). Then, referring to FIG. 23, a second gate dielectric layer 5 is deposited, as is a second semiconductor layer 6, for example using PVD or any other suitable technique. Then, these layers 5 and 6 are patterned, again using any suitable technique, for example lithography and etching, to produce the stepped, stacked structure shown in FIG. 23. Then, referring to FIG. 24, passivation dielectric material 7 is deposited over the structure shown in FIG. 23 and then patterned (for example using lithography and etching) to produce windows 71, 72 through to the second semiconductor portion PP6, a window 73 through to the gate P4, and a further window 74 through to one of the first layer electrodes 11. Then, referring to FIG. 25 conductive material is formed, for example by a deposition technique such as PVD, and then patterned (for example using lithography and etching, to yield electrodes 81, 82, 83, and 84.

Figure 25:
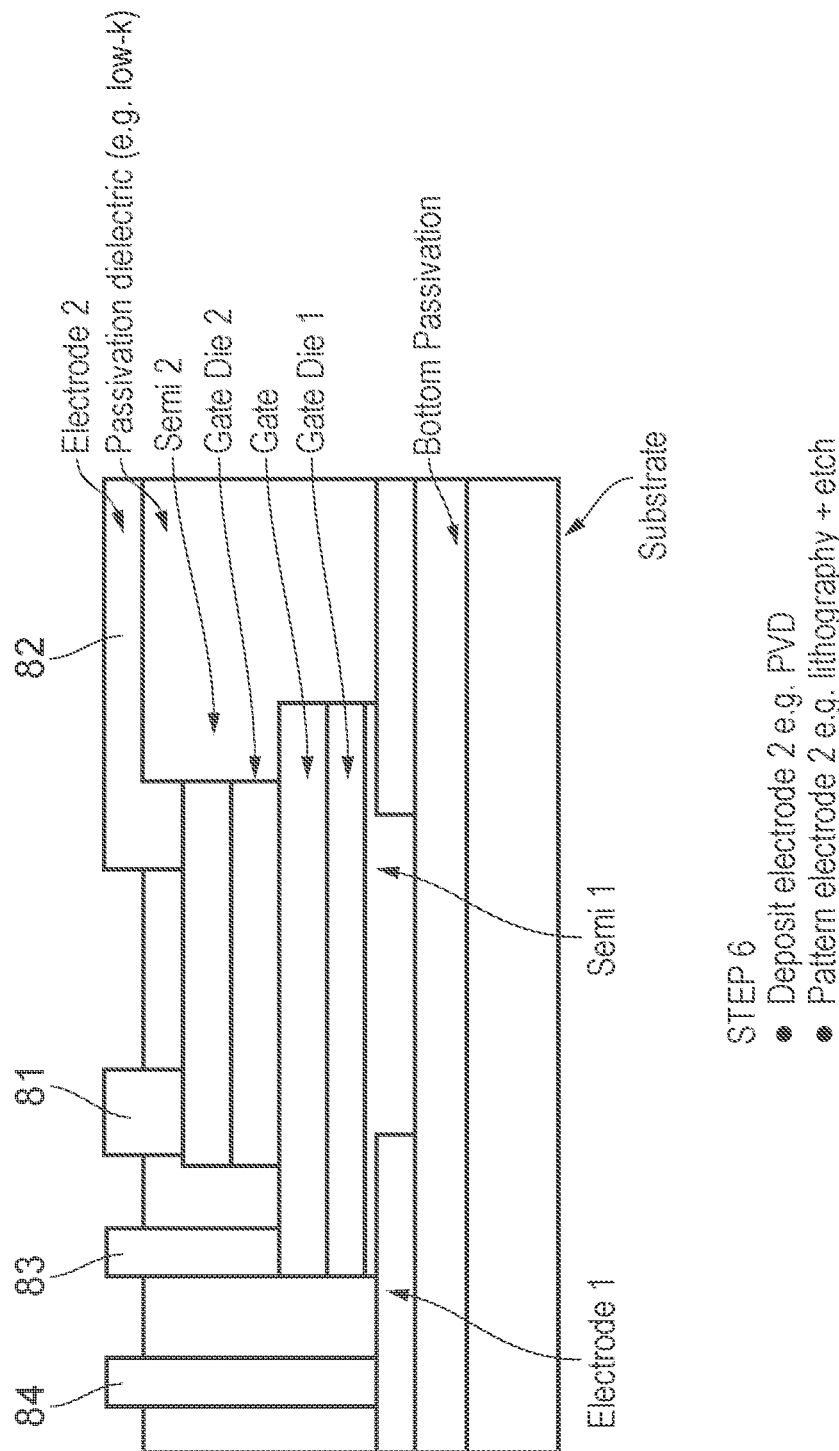
Figure 26:
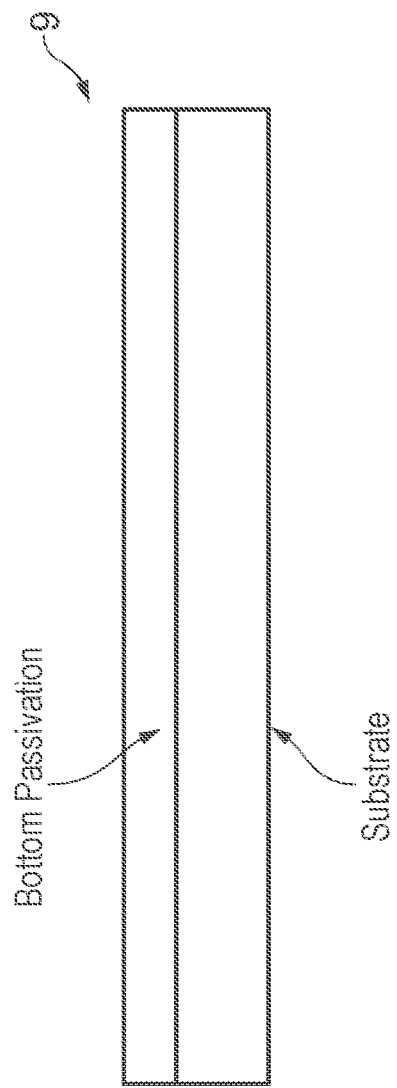
FIGS. 26-30 illustrate steps in another method embodying an aspect of the invention.
Figure 27:
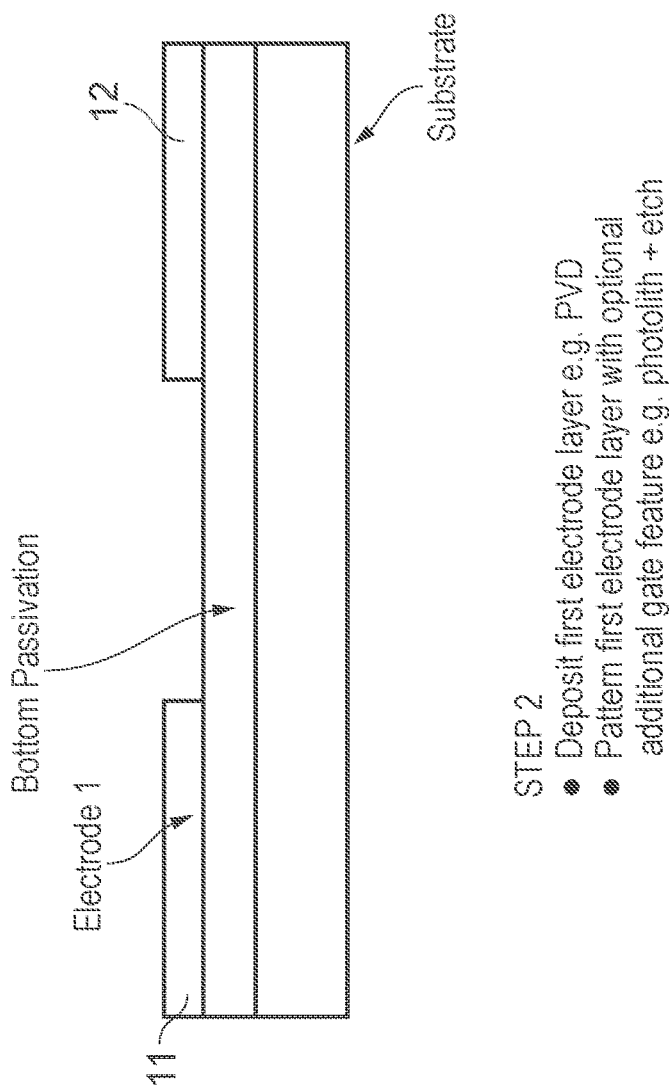
Figure 28:
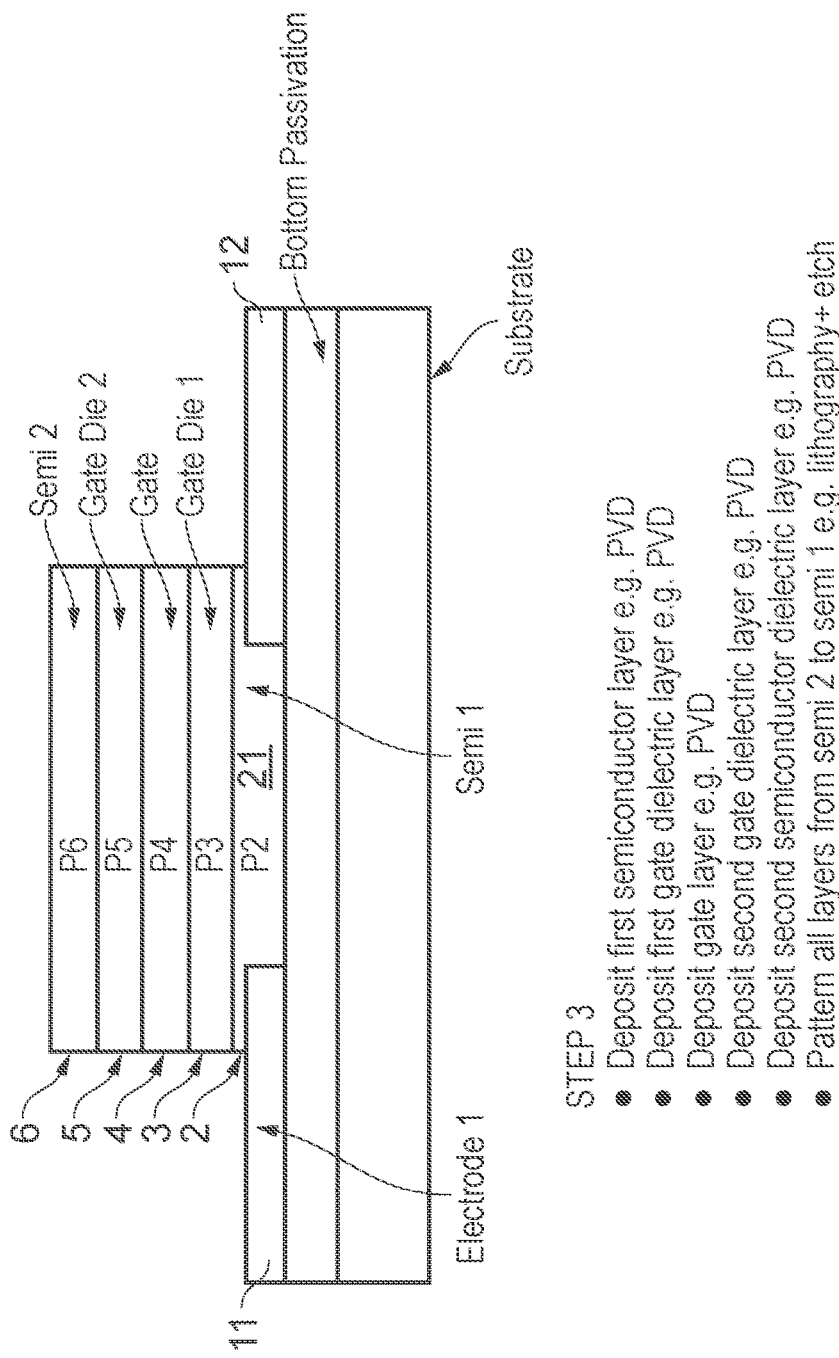

Thus, the technique to manufacture the structure shown in FIG. 25 is similar to that used to produce the structure shown in FIG. 5, but provides the additional advantage that it enables via connections to be made between layers. At the same time, it maintains the quality of the gate dielectric/semiconductor interfaces, and maintains a compact footprint through vertical stacking.

Figure 29:
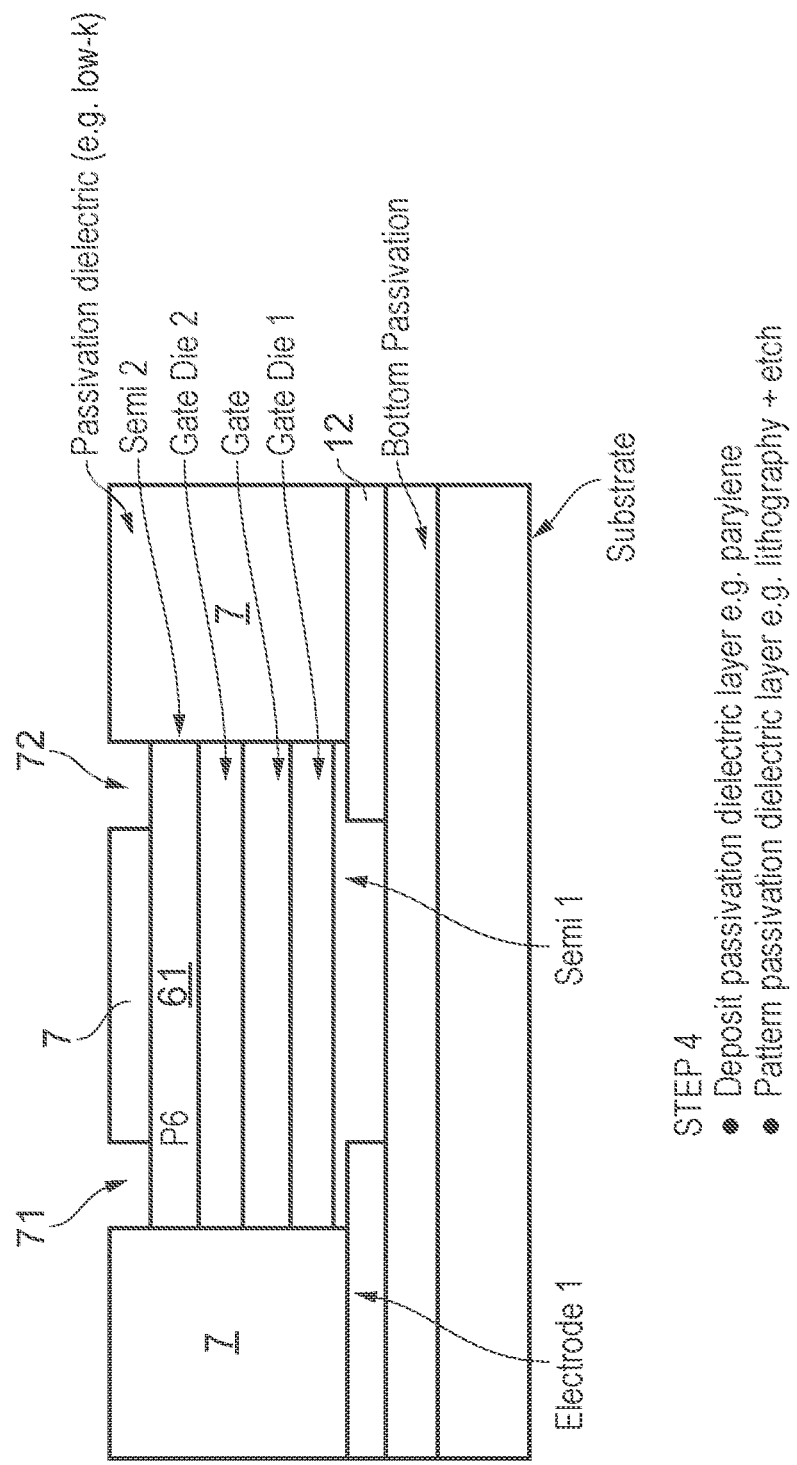
Figure 30:
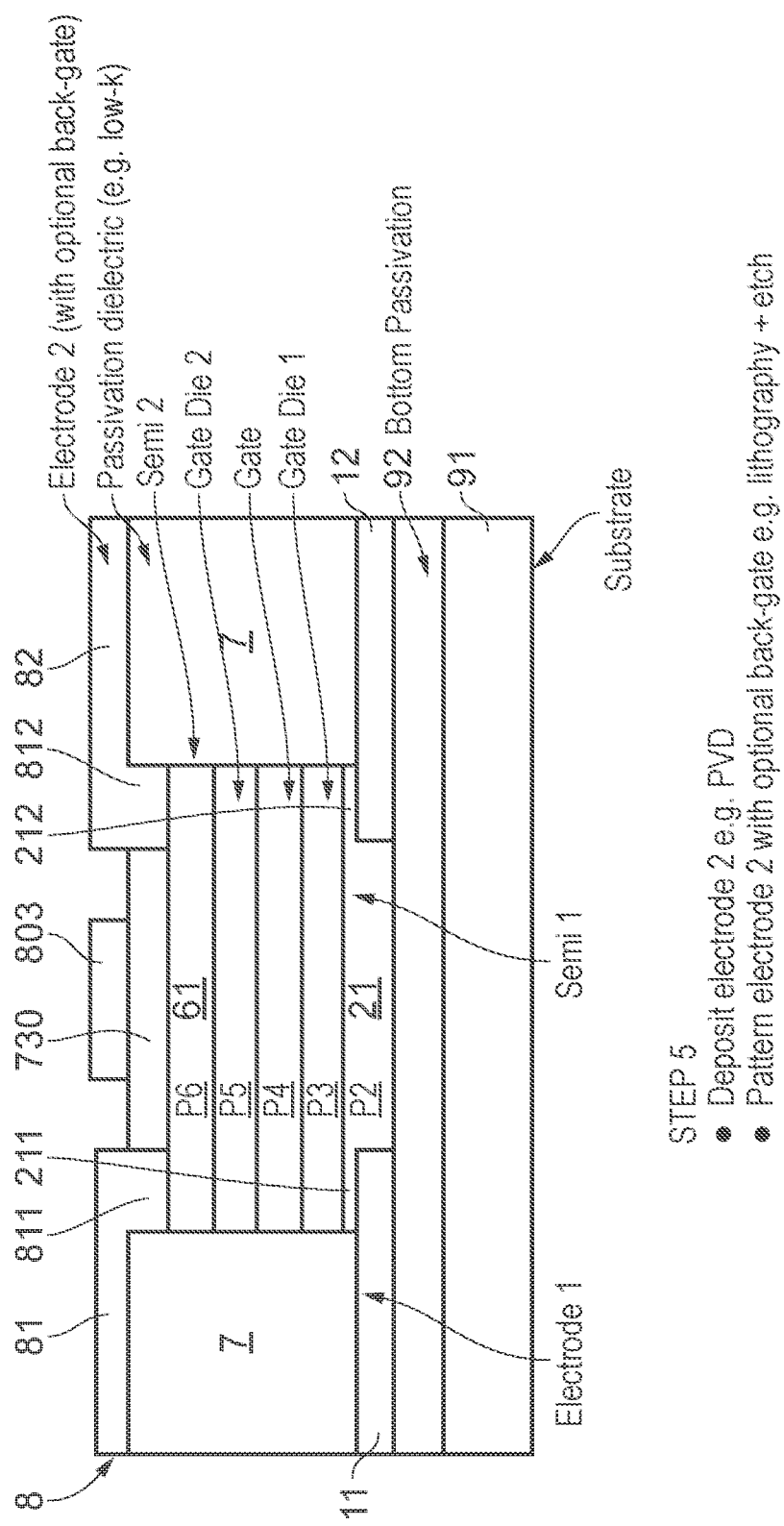

Referring now to FIG. 30, this illustrates another structure embodying an aspect of the invention. The structure is similar to that illustrated in FIG. 5 and described above, but has an additional gate 803 (which may be referred to as a back-gate) formed above the portion of the passivation dielectric 730 which is formed on top of the second semiconductor portion P6. The structure of FIG. 30 may be produced by a method as illustrated in FIGS. 26-30, starting with provision of a support or support structure 9 (see FIG. 26), followed by formation of the electrodes 11, 12 of the lower FET in the eventual stacked configuration. On top of the structure shown in FIG. 27, successive layers of semiconductor 2, dielectric 3, gate conductor 4, second gate dielectric 5, and second semiconductor 6 may be formed, and then patterned by a suitable technique to form the aligned, stacked structure shown in FIG. 28. A passivation dielectric 7 may then be formed and patterned as shown in FIG. 29. The upper electrode layer 8 may then be formed (for example by deposition, such as PVD) and then patterned to define separate electrodes 81 and 82 and the optional back-gate 803. The formation of the stacked structure shown in FIG. 28 may, in alternative embodiments, be split into multiple stages, such that the patterning of each layer above the support 9 and electrodes 11, 12 need not necessarily be performed at the same time. Advantageously, the additional gate 803 (or back-gate) can be used to provide additional control to one or both of the N and P-type devices, for example to adjust threshold voltage. Although the formation of the additional gate 803 separate from the electrodes 81 and 82 may be achieved using a variety of conventional techniques, such as lithography and etching, certain embodiments may utilise techniques involving reverse-side illumination, as described elsewhere in this document, to produce accurate self-alignment, for example using the first electrode layer (comprising electrodes 11 and 12) as an in-situ photo mask.

Figure 31:
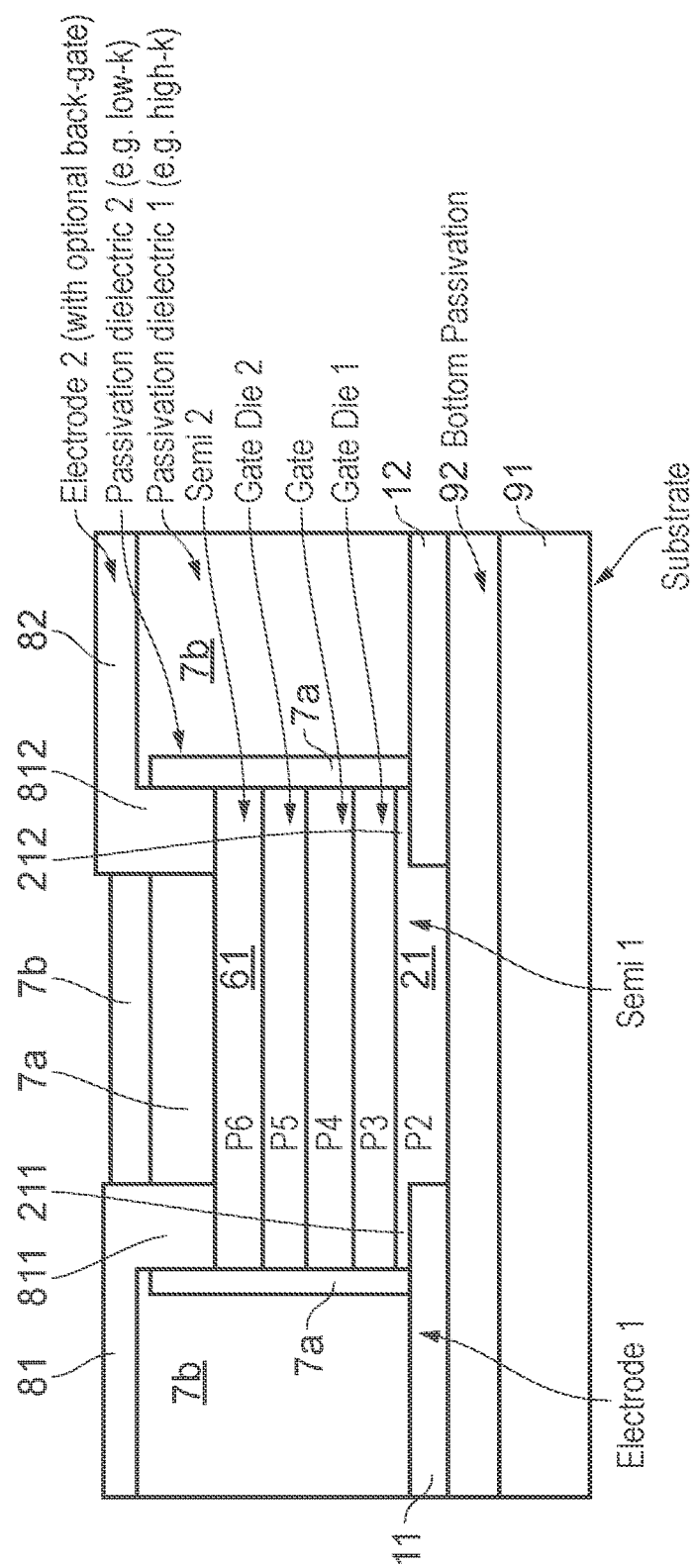
FIG. 31 illustrates another electronic structure embodying an aspect of the present invention.

Referring now to FIG. 31, this shows another structure embodying the invention. This structure is similar to that illustrated in FIG. 5 and may, generally, be produced by similar methods. However, rather than having a single layer 7 of passivation dielectric material, this embodiment incorporates a first passivation dielectric 7a (which may, for example, be high-k material), and a second layer or body of passivation dielectric material 7b (e.g. low-k material). It will be appreciated that, after forming the stack of portions P2-P6 on the underlying electrode and support structure 11, 12, 9, the first passivation dielectric material 7a may be formed over the stack and optionally the electrodes 11, 12, and then optionally patterned as required, to expose/uncover portions of the electrodes 11, 12. The second passivation dielectric 7b may then be formed over the first passivation dielectric 7a and then patterned to produce windows 71 and 72, which are then filled with conductive material to form the vias 811 and 812 of the electrodes 81 and 82. Advantageously, the two passivation dielectrics 7a and 7b help to minimise parasitic capacitance between electrode 2 (that is electrode defined by portion P6) and a gate P4. This concept of utilising two passivation dielectrics may be applied to the above-mentioned aspects and embodiments of the invention.

In certain embodiments the substrate comprises at least one material (e.g. in the form of a layer of that material) selected from a list comprising: glass (rigid or flexible); polymer (e.g. polyethylene naphthalate or polyethylene terephthalate); polymeric foil; paper; insulator coated metal (e.g. coated stainless-steel); cellulose; parylene; polymethyl methacrylate; polycarbonate, polyvinylalcohol; polyvinyl acetate; polyvinyl pyrrolidone; polyvinylphenol; polyvinyl chloride; polystyrene; polyethylene naphthalate; polyethylene terephthalate; polyamide (e.g. Nylon); poly(hydroxyether); polyurethane; polycarbonate; polysulfone; polyarylate; acrylonitrile butadiene styrene, 1-Methoxy-2-propyl acetate (SU-8), polyhydroxybenzyl silsesquioxane (HSQ), polyimide, Benzocyclobutene (BCB), $Al_2O_3$, $SiO_xN_y$, $SiO_2$, $Si_3N_4$; UV-curable resin; Nanoimprint resist; photoresist.

A wide variety of techniques may also be used to form the at least one layer of resist material, and a variety of resist materials may be employed in different embodiments of the invention. These methods of forming the at least one layer of resist material include coating (spin, dip, blade, bar, spray, slot-die) or extrusion. Suitable resist materials include poly hydroxybutyrate, polymethyl methacrylate, polyvinylalcohol, polyvinyl acetate, polyvinyl pyrrolidone, polyvinylphenol, polyvinyl chloride, polystyrene, polyamide (e.g. Nylon), poly(hydroxyether), polyurethane, polycarbonate, polysulfone, polyarylate, acrylonitrile butadiene styrene, polyimide, benzocyclobutene (BCB), photoresist, 1-Methoxy-2-propyl acetate (SU-8), polyhydroxybenzyl silsesquioxane (HSQ), fluorinated polymers e.g. PTFE, uv curable liquid resin (such as those described in U.S. Pat. No. 6,284,072), silicone, silioxane, parylene. Commercial imprint resists are available through companies such as Microchem/Microresist, Shipley and Nanolithosolution Inc.

A wide variety of semiconductive materials may be used in embodiments of the invention, including for example: metal oxides such as zinc oxide, tin oxide, nickel oxide, tin(II) oxide, tin (IV) oxide, cuprous oxide; inorganic semiconductor such as amorphous, microcrystalline or nanocrystalline silicon; binary semiconductors such as gallium arsenide; ternary semiconductors such as InGaAs; quaternary semiconductors such as InGaAsSb; binary metal oxides such as lithium zinc oxide, zinc tin oxide, indium tin oxide, indium zinc oxide; ternary metal oxides such as GaInZnO; metal oxynitrides e.g. $Zn_xO_yN_z$; organic or polymer semiconductors (n- and p-type). Chalcogenide materials may also be deposited in semiconducting form, including $MoS_2$, GST. Doping of any of these materials may be applied to adjust the properties so that they are perform better as semiconducting materials.

The depositing of dielectric material can be performed using a variety of techniques, including: vapour deposition (physical e.g. sputter; chemical e.g. PECVD); vacuum deposition (e.g. thermal or e-beam evaporation); coating e.g. spray, spin, slot, die; printing e.g. jet; pulsed-laser deposition (PLD); atomic-layer deposition (ALD).

Dielectric materials suitable for use in embodiments of the invention include the following: benzocyclobutene (BCB); polyimide; polymethyl methacrylate, polybutyl methacrylate, polyethyl methacrylate, polyvinyl acetate, polyvinyl pyrrolidone, polyvinylphenol, polyvinylchloride, polystyrene, polyethylene, polyvinyl alcohol, polycarbonate, parylene; inorganic insulator such as silica, silicon nitride, metal oxide (e.g. $Al_2O_3$, $HfO_2$, $TiO_2$, $Ta_2O_5$, $Y_2O_5$, $ZrO_2$), metal phosphates (e.g. $Al_2PO_x$), metal sulphates/sulfites (e.g. $HfSO_x$), metal oxynitrides (e.g. $AlO_xN_y$), metal nitride (AlN), silicone, silioxane, $SiN_x$ Examples of low-k dielectrics include Cytop, HSQ, parylene.

Examples of high-k dielectrics include $Ta_2O_5$, $HfO_2$.

The depositing of electrically conductive material can be achieved using a variety of techniques, including: vapour deposition (physical e.g. sputter; chemical e.g. PECVD); vacuum deposition (e.g. thermal or e-beam evaporation); coating e.g. spray, spin, slot, die; printing e.g. jet; pulsed-laser deposition (PLD); atomic-layer deposition (ALD).

A wide range of materials can be used as the electrically conductive material, including for example: metal (e.g. Au, Ag, Ti, Al, Cr, Ni, Cu, Ta, W, Pt, Mo etc.), metal alloys (e.g. MoNi, MoCr, AlSi) transparent conductive oxide (e.g. ITO, AZO, IZO), metal nitrides (e.g. TiN), carbon black, carbon nanotubes, conducting polymer (e.g. polyaniline, PEDOT: PSS)

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A method of manufacturing an electronic structure comprising a first Field Effect Transistor (FET) and a second FET, the method comprising:
   providing a support;
   forming a first source terminal, a first drain terminal, and a first layer or body of semiconductive material supported on the support, the first layer or body of semiconductive material providing a first semiconductive channel connecting the first source terminal to the first drain terminal;
   forming a first layer or body of dielectric material over the first layer or body of semiconductive material;
   forming a layer or body of conductive material over the first layer or body of dielectric material;
   forming a second layer or body of dielectric material over the layer or body of conductive material;
   forming a second layer or body of semiconductive material over the second layer or body of dielectric material;
   patterning the first and second layers or bodies of semiconductive material, the first and second layers or bodies of dielectric material, and said layer or body of conductive material to uncover portions of the first source and first drain terminals and produce a stack comprising the first semiconductive channel, a portion of the first layer or body of dielectric material over said first channel, a portion of the layer or body of conductive material over said first channel, a portion of the layer or body of second dielectric material over said first channel, and a portion of the second layer or body of semiconductive material over the first channel;

forming at least one further layer or body of dielectric material over the stack to cover the stack and said uncovered portions of the first source and drain terminals;

patterning the at least one further layer or body of dielectric material to form first and second windows through the at least one further layer or body of dielectric material to said portion of the second layer or body of semiconductive material; and forming a second source terminal comprising a conductive material at least partially filling the first window, and a second drain terminal comprising a conductive material at least partially filling the second window, such that said portion of the second layer or body of semiconductive material provides a second semiconductive channel, connecting the second source terminal to the second drain terminal, wherein the first FET comprises the first source terminal, the first drain terminal, the first channel, and said portion of the layer or body of conductive material, the second FET comprises the second source terminal, the second drain terminal, the second channel, and said portion of the layer or body of conductive material.

2. A method in accordance with claim 1, wherein said stack overlaps at least one of the first source and first drain terminals.

3. A method in accordance with claim 2, wherein said stack overlaps both of the first source and first drain terminals.

4. A method in accordance with claim 3, wherein said first window is positioned above a portion of the first source terminal overlapped by the stack and said second window is positioned above a portion of the first drain terminal overlapped by the stack.

5. A method in accordance with claim 1, wherein said stack does not overlap either the first source or the first drain terminal.

6. A method in accordance with claim 1, wherein said forming of the first source terminal, the first drain terminal, and the first layer or body of semiconductive material supported on the support comprises:

forming a first layer or body of conductive material on the support;

patterning the first layer or body of conductive material to define the first source terminal, the first drain terminal, and a first gap separating the first source terminal and the first drain terminal; and forming the first layer or body of semiconductive material covering the first source and first drain terminals and filling the first gap so as to provide the first semiconductive channel connecting the first source terminal to the first drain terminal.

7. A method in accordance with claim 1, wherein said patterning the at least one further layer or body of dielectric material to form first and second windows further comprises forming at least one of a third window down to the portion of the layer or body of conductive material and a fourth window down to one of the first source terminal and the first drain terminal.

8. A method of manufacturing an electronic structure comprising a first Field Effect Transistor (FET) and a second FET, the method comprising:

providing a support;

forming a first source terminal, a first drain terminal, and a first layer or body of semiconductive material supported on the support, the first layer or body of semiconductive material providing a first semiconductive channel connecting the first source terminal to the first drain terminal;

forming a first layer or body of dielectric material over the first layer or body of semiconductive material;

forming a layer or body of conductive material over the first layer or body of dielectric material;

patterning the first layer or body of semiconductive material, the first layer or body of dielectric material, and said layer or body of conductive material to uncover at least portions of the first source and first drain terminals and produce a first stack comprising the first semiconductive channel, a portion of the first layer or body of dielectric material over said first channel, and a portion of the layer or body of conductive material over said first channel;

forming a second layer or body of dielectric material over the first stack and uncovered portions of the first source and first drain terminals;

forming a second layer or body of semiconductive material over the second layer or body of dielectric material;

patterning the second layer or body of semiconductive material and the second layer or body of dielectric material to uncover said at least portions of the first source and first drain terminals and produce a second stack comprising the first semiconductive channel, said portion of the first layer or body of dielectric material over said first channel, said portion of the layer or body of conductive material over said first channel, a portion of the layer or body of second dielectric material over said first channel, and a portion of the second layer or body of semiconductive material over the first channel;

forming at least one further layer or body of dielectric material over the second stack to cover the second stack and said uncovered portions of the first source and drain terminals;

patterning the at least one further layer or body of dielectric material to form first and second windows through the at least one further layer or body of dielectric material to said portion of the second layer or body of semiconductive material;

forming a second source terminal comprising a conductive material at least partially filling the first window, and a second drain terminal comprising a conductive material at least partially filling the second window, such that said portion of the second layer or body of semiconductive material provides a second semiconductive channel, connecting the second source terminal to the second drain terminal, whereby the first FET comprises the first source terminal, the first drain terminal, the first channel, and said portion of the layer or body of conductive material, the second FET comprises the second source terminal, the second drain terminal, the second channel, and said portion of the layer or body of conductive material.

9. A method in accordance with claim 8, wherein said patterning to uncover at least portions of the first source and first drain terminals and produce said first stack comprises forming a layer of photoresist over said layers to be patterned, exposing the structure from below with electromagnetic radiation such that the first source and first drain terminals shield portions of the photoresist from said radiation and a portion of the photoresist above the first semiconductive channel is exposed, processing the photoresist to leave the exposed portion and remove the shielded portions, removing portions of the layers to be patterned that were beneath the shielded portions, and then removing the exposed portion of the photoresist from a top of the first stack.

10. A method in accordance with claim 8, wherein said patterning of the at least one further layer or body of dielectric material to form said first and second windows comprises:
   forming a layer or body of photoresist on the at least one further layer or body of dielectric material;
   exposing the photoresist to radiation through a mask arranged to leave portions unexposed and expose a portion over the second semiconductive channel;
   processing the photoresist to reduce a solubility of the exposed portion;
   exposing the structure to radiation from below such that the first source terminal and the first drain terminal shield portions of the photoresist and further portions are reverse exposed;
   processing the photoresist to remove the reverse exposed portions and form windows through the photoresist;
   removing a material of the at least one further layer or body of dielectric material through said windows in the photoresist to form said first window and said second window; and
   removing a remaining photoresist material.

11. A method in accordance with claim 8, wherein said second stack does not overlap either the first source terminal or the first drain terminal.

12. A method in accordance with claim 8, wherein said patterning of the second layer or body of semiconductive material and the second layer or body of dielectric material to uncover at least portions of the first source and first drain terminals and produce a second stack is further arranged to uncover at least one portion of the layer or body of conductive material.

13. A method in accordance with claim 12, further comprising forming a via to said at least one portion of the layer or body of conductive material.

14. A method in accordance with claim 8, wherein said forming of the first source terminal, the first drain terminal, and the first layer or body of semiconductive material supported on the support comprises:
   forming a first layer or body of conductive material on the support;
   patterning the first layer or body of conductive material to define the first source terminal, the first drain terminal, and a first gap separating the first source terminal and the first drain terminal; and
   forming the first layer or body of semiconductive material covering the first source and first drain terminals and filling the first gap so as to provide the first semiconductive channel connecting the first source terminal to the first drain terminal.

15. A method in accordance with claim 8, wherein said patterning the at least one further layer or body of dielectric material to form first and second windows further comprises forming at least one of a third window down to the portion of the layer or body of conductive material and a fourth window down to one of the first source terminal and the first drain terminal.

16. A method of manufacturing an electronic structure comprising a first field Effect Transistor (FET) and a second FET, the method comprising:
   providing a support;
   forming a first source terminal, a first drain terminal, and a first layer or body of semiconductive material supported on the support, the first layer or body of semiconductive material providing a first semiconductive channel connecting the first source terminal to the first drain terminal;
   forming a first layer or body of dielectric material over the first layer or body of semiconductive material;
   forming a layer or body of conductive material over the first layer or body of dielectric material;
   forming a second layer or body of dielectric material over the layer or body of conductive material;
   forming a second layer or body of semiconductive material over the second layer or body of dielectric material;
   patterning the first and second layers or bodies of semiconductive material, the first and second layers or bodies of dielectric material, and said layer or body of conductive material to uncover at least portions of the first source and first drain terminals and produce a stack comprising the first semiconductive channel, a portion of the first layer or body of dielectric material over said first channel, a portion of the layer or body of conductive material over said first channel, a portion of the layer or body of second dielectric material over said first channel, and a portion of the second layer or body of semiconductive material over the first channel;
   forming at least one further layer or body of dielectric material over the stack to cover the stack and said uncovered portions of the first source and drain terminals;
   patterning the at least one further layer or body of dielectric material to form first and second windows through the at least one further layer or body of dielectric material to said portion of the second layer or body of semiconductive material;
   forming a second source terminal comprising a conductive material at least partially filling the first window, and a second drain terminal comprising a conductive material at least partially filling the second window, such that said portion of the second layer or body of semiconductive material provides a second semiconductive channel, connecting the second source terminal to the second drain terminal,
   whereby the first FET comprises the first source terminal, the first drain terminal, the first channel, and said portion of the layer or body of conductive material, the second FET comprises the second source terminal, the second drain terminal, the second channel, and said portion of the layer or body of conductive material.

17. A method in accordance with claim 16, wherein said patterning to uncover at least portions of the first source and first drain terminals and produce said stack comprises forming a layer of photoresist over said layers to be patterned, exposing the structure from below with electromagnetic radiation such that the first source and first drain terminals shield portions of the photoresist from said radiation and a portion of the photoresist above the first semiconductive channel is exposed, processing the photoresist to leave the exposed portion and remove the shielded portions, removing portions of the layers to be patterned that were beneath the shielded portions, and then removing the exposed portion of the photoresist from a top of the stack.

18. A method in accordance with claim 16, wherein said patterning of the at least one further layer or body of dielectric material to form said first and second windows comprises:
   forming a layer or body of photoresist on the at least one further layer or body of dielectric material;
   exposing the photoresist to radiation through a mask arranged to leave portions unexposed and expose a portion over the second semiconductive channel;
   processing the photoresist to reduce a solubility of the exposed portion;
   exposing the structure to radiation from below such that the first source terminal and the first drain terminal shield portions of the photoresist and further portions are reverse exposed;
   processing the photoresist to remove the reverse exposed portions and form windows through the photoresist;
   removing a material of the at least one further layer or body of dielectric material through said windows in the photoresist, to form said first window and said second window; and
   removing a remaining photoresist material.

19. A method in accordance with claim 16, wherein said stack does not overlap either the first source terminal or the first drain terminal.

20. A method in accordance with claim 16, wherein said forming of the first source terminal, the first drain terminal, and the first layer or body of semiconductive material supported on the support comprises:
   forming a first layer or body of conductive material on the support;
   patterning the first layer or body of conductive material to define the first source terminal, the first drain terminal, and a first gap separating the first source terminal and the first drain terminal; and
   forming the first layer or body of semiconductive material covering the first source and first drain terminals and filling the first gap so as to provide the first semiconductive channel connecting the first source terminal to the first drain terminal.

21. A method in accordance with claim 16, wherein said patterning the at least one further layer or body of dielectric material to form first and second windows further comprises forming at least one of a third window down to the portion of the layer or body of conductive material and a fourth window down to one of the first source terminal and the first drain terminal.

* * * * *